(12) United States Patent
Ohwada et al.

(10) Patent No.: US 7,304,440 B2
(45) Date of Patent: Dec. 4, 2007

(54) ELECTRON-EMITTING APPARATUS

(75) Inventors: Iwao Ohwada, Nagoya (JP); Takayoshi Akao, Nagoya (JP); Tetsuyuki Kameji, Aichi-pref. (JP); Hirokazu Nakamura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 203 days.

(21) Appl. No.: 11/236,422

(22) Filed: Sep. 27, 2005

(65) Prior Publication Data
US 2006/0118827 A1   Jun. 8, 2006

(30) Foreign Application Priority Data
Sep. 30, 2004   (JP)   ............................. 2004-286633

(51) Int. Cl.
*G05F 1/00*   (2006.01)
(52) U.S. Cl. .................. 315/291; 315/169.1; 315/167; 315/360; 313/502; 313/311
(58) Field of Classification Search ................ 315/160, 315/161, 167, 169.1, 169.3, 291, 360, 306–308, 315/310–311, 483–485, 491, 495–497, 502, 315/506, 509; 257/79, 88, 212
See application file for complete search history.

(56) References Cited

U.S. PATENT DOCUMENTS

| | | | | |
|---|---|---|---|---|
| 2003/0102793 A1* | 6/2003 | Komoda et al. | ............. | 313/311 |
| 2005/0073233 A1* | 4/2005 | Takeuchi et al. | ............. | 313/311 |
| 2005/0073235 A1* | 4/2005 | Takeuchi et al. | ............. | 313/311 |
| 2005/0073261 A1* | 4/2005 | Takeuchi et al. | ......... | 315/169.1 |
| 2005/0104504 A1* | 5/2005 | Takeuchi et al. | ............. | 313/495 |
| 2005/0116603 A1* | 6/2005 | Takeuchi et al. | ............. | 313/311 |
| 2006/0138950 A1* | 6/2006 | Adachi et al. | .............. | 313/506 |
| 2007/0018588 A1* | 1/2007 | Koyama | ..................... | 315/167 |
| 2007/0108886 A1* | 5/2007 | Miyazaki et al. | ........... | 313/495 |

FOREIGN PATENT DOCUMENTS

| | | |
|---|---|---|
| EP | 1 463 022 | 9/2004 |
| EP | 1 635 370 | 3/2006 |
| JP | 10-308189 | 11/1998 |
| JP | 3160213 | 2/2001 |

* cited by examiner

*Primary Examiner*—Thuy V. Tran
*Assistant Examiner*—Tung X Le
(74) *Attorney, Agent, or Firm*—Burr & Brown

(57) ABSTRACT

An electron emitting apparatus includes a lower electrode, an emitter section made of a dielectric material, a plurality of upper electrodes having micro through holes, and a collector electrode opposing the upper electrodes. In this electron-emitting apparatus, electrons are accumulated in the emitter section by controlling the potential difference (drive voltage) between the lower and upper electrodes with respect to the potential of the lower electrode to a negative predetermined voltage. At this time, the collector electrode of the electron-emitting apparatus is grounded. Thus, unnecessary electron-emitting is suppressed. Subsequently, the drive voltage is changed to a positive predetermined voltage. As a result, polarization reversal occurs in the emitter section, and accumulated electros are emitted through the micro through holes in the upper electrodes by Coulomb repulsion. At this time, a positive voltage Vc is applied to the collector electrode to give large energy to accelerate the electrons.

8 Claims, 20 Drawing Sheets

ELECTRON-EMITTING APPARATUS

This application claims the benefit of Japanese Application No. 2004-286633, filed Sep. 30, 2004, the entirety of which is incorporated herein by reference.

BACKGROUND OF THE INVENTION

1. Field of the Invention

The present invention relates to an electron-emitting apparatus including an emitter section made of a dielectric material, a lower electrode disposed below the emitter section, and an upper electrode disposed above the emitter section.

2. Description of the Related Art

In the related art, an electron-emitting apparatus including an emitter section made of a dielectric material, a lower electrode (lower electrode layer) disposed below the emitter section, and an upper electrode (upper electrode layer) disposed above the emitter section and having numerous micro trough holes has been known. According to this type of electron-emitting apparatus, a high-voltage pulse is applied between the upper electrode and the lower electrode to reverse the polarization of the dielectric material and to thereby emit electrons through the micro through holes in the upper electrode (e.g., refer to Japanese Patent No. 3160213, claim 1, paragraphs 0016 to 0019, and FIGS. 2 and 3).

This type of apparatus is applicable to displays. For example, as shown in FIG. 22, an electro-emitting apparatus applied to a display includes a transparent plate 17, a collector electrode 18, and phosphors 19 opposite to upper electrodes 14. According to this electron-emitting apparatus, the phosphors 19 are irradiated with electrons emitted from an emitter section 13 through micro through holes (not shown) in the upper electrodes 14, and thereby generate light. The collector electrode 18 is provided to accelerate the emitted electrons, and a predetermined positive voltage Vc is constantly applied to the collector electrode 18.

A control for light emission by electron emission is performed by, for example, a scheme shown in FIG. 23. Specifically, from time t10 to time t20, the electro-emitting apparatus sets a drive voltage Vin between an upper electrode 14 and a lower electrode 12 (i.e., the potential difference between the lower and upper electrodes with respect to the potential of the lower electrode 12) at a particular negative value so as to reverse the orientation of dipoles (polarization reversal) in the emitter section 13 and to thereby supply electrons from the upper electrode 14 to the emitter section 13. The electrons are thereby accumulated mainly near the upper portion of the emitter section 13. At the time t20, the electron-emitting apparatus sets the drive voltage Vin at a predetermined positive value so as to reverse the polarization of the emitter section 13 for the second time. This polarization reversal allows the electrons accumulated near the upper portion of the emitter section 13 to travel in the upward direction due to Coulomb repulsion. As a result, the phosphor 19 is irradiated with electrons and thereby emits light. Subsequently, at a time t30, the electro-emitting apparatus sets the drive voltage Vin at the predetermined negative value again so as to resume the accumulation of the electrons, and, at a time t40, sets the drive voltage Vin at the predetermined positive value to allow the electrons to be emitted in the upward direction, thereby achieving light emission.

SUMMARY OF THE INVENTION

The present inventors have found that immediately after time t30 (the time at which the drive voltage Vin is changed to the predetermined negative value for electron accumulation) or immediately after time t40 (the time at which the drive voltage Vin is changed to the predetermined positive value for electron emission), unnecessary emission, such as electron emission at an unexpected timing and/or excessive electron emission that leads to abnormally intense light emission (extremely strong light emission), sometimes occurs.

The reason for this is unclear, however, may be due to the fact that, from the experiments, a large inrush current flows in the emitter section immediately after the switching of the drive voltage Vin and that the potential difference (hereinafter also referred to as "element voltage") between the upper electrode and the lower electrode of an actual element dramatically changes after completion of the polarization reversal in the emitter section. Emission of abnormally intense light is presumably caused by dielectric breakdown between the upper electrode 14 and the collector electrode 18 due to generation of plasma between the upper electrode 14 and the collector electrode 1B. Once such intense light emission occurs, emission of abnormally intense light may continue due to continuation of the plasma state.

Unnecessary electron emission decreases the color purity and the contrast of the images in the display. Moreover, emission of abnormally intense light sometimes scatters the materials that constitute the upper electrode 14 and destroy the upper electrode 14, or even pierces holes in the emitter section 13, thereby damaging the electron-emitting apparatus.

The present invention has been made based on these findings. It is one of objects of the present invention to avoid unnecessary electron emission by properly controlling the voltage and the like applied to the collector electrode. Since the collector electrode is arranged to oppose the upper electrode, unnecessary electron emission can be suppressed by controlling the voltage and the like applied to the collector electrode.

In order to achieve the above-described object, the present invention provides an electron-emitting apparatus comprising:

an element including:
an emitter section made of a dielectric material,
a lower electrode disposed below the emitter section, and
an upper electrode disposed above the emitter section to be opposed to the lower electrode with the emitter section therebetween, the upper electrode having a plurality of micro through holes;
a collector electrode disposed above the upper electrode to be opposed to the upper electrode;
drive voltage applying means for repeatedly applying a drive voltage between the lower electrode and the upper electrode on a periodic basis, the drive voltage being a voltage that sets an interelectrode voltage at a negative predetermined voltage so as to allow accumulation of electrons supplied from the upper electrode in the emitter section near the upper electrode, the interelectrode voltage being the potential difference between the lower electrode and the upper electrode with reference to the potential of the lower electrode, the drive voltage subsequently being a voltage that sets the interelectrode voltage at a positive predetermined voltage so as to allow emission of the electrons accumulated in the emitter section through the micro through holes; and collector voltage applying means for applying a first collector voltage to the collector electrode so that a collector voltage, which is a potential difference between the upper electrode and the collector electrode with reference to the potential of the upper electrode, becomes a positive first predetermined voltage.

With this structure, when the voltage between the upper and lower electrodes (the potential difference between the upper and lower electrodes with reference to the potential of the lower electrode) is controlled to reach a negative particular voltage, dipoles in the emitter section is reversed so that the positive poles orient toward the upper electrode. This phenomenon is hereinafter also referred to as the "negative-side polarization reversal". As a result, electrons are supplied from the upper electrode to the emitter section, and the electrons are accumulated in the upper portion of the emitter section. When the interelectrode voltage is changed to a positive predetermined voltage, dipoles in the emitter section is reversed so that the negative poles orient toward the upper electrode. This phenomenon is hereinafter also referred to as the "positive-side polarization reversal". As a result, the electrons accumulated in the emitter section are emitted upward through the micro through holes in the upper electrode by Coulomb repulsion.

The collector voltage applying means either applies a second collector voltage to the collector electrode so that the collector voltage is changed from the first predetermined voltage to a second predetermined voltage smaller than the first predetermined voltage at a particular time described below (this particular time is referred to as "collector electrode OFF time" for convenience sake), or causes the collector electrode to enter a floating state at the particular time.

When the second collector voltage is applied to the collector electrode or when the collector electrode is put into the floating state, the collector electrode forms no electric field that attracts the emitted electrons, or decreases the intensity of the electric field. Thus, unnecessary electron emission (unnecessary light emission in case where a phosphor opposed to the upper electrode is provided such as in a display) can be avoided.

Subsequently, the collector voltage applying means resumes the application of the first collector voltage to the collector electrode at another particular time (this time is referred to as the "collector electrode ON time" for convenience sake). As a result, the emitted electrons travel in the upward direction of the upper electrode while being accelerated (given high energy) by the electric field produced by the collector electrode. Thus, high luminance can be obtained if a phosphor is disposed above the upper electrode. In other words, since the collector electrode to which the first collector voltage is applied attracts the electrodes, a required amount of electrons can approach near the collector electrode.

In the present invention, as shown in FIG. 8, the collector electrode OFF time is a particular time within a period starting from a first time point (1) (a time t6) and ending at a second time point (2) (a time t7). Here, the first time point (1) is a time at which the electron emission caused by changing the interelectrode voltage to the positive predetermined voltage is substantially completed, and the second time point (2) is a time at which the interelectrode voltage is changed to the negative predetermined voltage. During this period, the electrons have already been emitted from the emitter section and do not remain in the emitter section. Thus, there is no need to apply the first collector voltage to the collector electrode.

The collector electrode ON time may be set at a variety of time points described in cases as follows:

(1) A case in which the collector electrode ON time is set to be a particular time within a period represented by reference character A in FIG. 8, starting from a third time point (3) (a time t10) and ending at a second first time point (the first time point (1), a time t16) that comes after the third time point (3), the third time point (3) being a time at which the electron accumulation is substantially completed by changing the interelectrode voltage to the negative predetermined voltage.

According to the collector electrode ON time in the case (1) above, at least during a period from the time t7 (the second time point (2)) to the time t10 (the third time point (3)), either the collector voltage is maintained at the second predetermined voltage because the second collector voltage is applied to the collector electrode or the collector electrode is maintained in the floating state. Here, the time t7 is a time at which the interelectrode voltage is changed to the negative predetermined voltage to start electron accumulation, and the time t10 is the time at which the electron accumulation is completed.

Thus, it becomes possible to suppress unnecessary electron emission presumably due to a large inrush current flowing in the emitter section immediately after the interelectrode voltage is changed to the negative predetermined voltage to start electron accumulation at the time t7 (the second time point (2)). Moreover, it becomes possible to suppress unnecessary electron emission presumably due to "a large rate of change in the element voltage after the coercive field" that would occur after a time t9 at which the negative coercive field voltage is exceeded but before the time t10 (the third time point (3)) at which the electron accumulation is completed.

Moreover, since the first collector voltage is applied to the collector electrode before, at the latest, the time t16 (the second first time point (1)) at which the electron emission is completed, electrons emitted properly can be led toward the collector electrode.

In addition, even if plasma is generated between the upper electrode and the collector electrode, the plasma can be eliminated since the collector electrode is intermittently turned off. As a result, continuous generation of Intense emission due to a continuing plasma state can be avoided. This advantage is common to other embodiments of the present invention.

(2) A case in which the collector electrode ON time is set at a fourth time point (4) (a time t11 in FIG. 8) at which the interelectrode voltage is again changed to the positive predetermined voltage (the point indicated by reference character B in FIG. 8).

In this case, the collector voltage is changed to the second predetermined voltage by the application of the second collector voltage to the collector electrode or the collector electrode is maintained in the floating state, at least during the period from the time t7 (the second time point (2)) to the time t11 (a fourth time point (4)). Here, the time t7 is when the interelectrode voltage is changed to the negative predetermined voltage to initiate electron accumulation, and the time t11 is when the interelectrode voltage is again changed to the positive predetermined voltage.

Thus, as in the case (1) above, it becomes possible to suppress unnecessary electron emission presumably due to a large inrush current flowing in the emitter section immediately after the interelectrode voltage is changed to the negative predetermined voltage to start electron accumulation at the time t7 (the second time point (2)). Moreover, it becomes possible to suppress unnecessary electron emission presumably due to "a large rate of change in element voltage after the coercive field" that would occur after a time t9 at which the negative coercive field voltage is exceeded but before a time t10 (the third time point (3)) at which the electron accumulation is completed.

In addition to these advantages, it becomes possible to lead electrons emitted properly to near the collector electrode since the first collector voltage is applied to the collector electrode over the entire period of electron emission, i.e., the period from the time t11 to immediately before the time t16.

Moreover, since the timing for applying the positive predetermined voltage between the electrodes, i.e., the time t11 (the fourth time point (4)), is coincident with the timing for applying the first collector voltage to the collector electrode, the configuration of the drive circuit for conducting such operations can be simplified.

(3) A case in which the collector electrode ON time is set at a particular time within the period from immediately after a fifth time point (5) (a time t12) to a sixth time point (6) (a time t14), i.e., the period indicated by reference character C in FIG. 8, the fifth time point (5) being a time at which the inrush current in the emitter section becomes the maximum by again changing the interelectrode voltage to the positive predetermined voltage, and the sixth time point (6) being a time at which the polarization reversal (the positive-side polarization reversal) in the emitter section is substantially completed.

According to the collector electrode ON time in the case (3) above, either the collector voltage becomes the second predetermined voltage by the application of the second predetermined voltage to the collector electrode or the collector electrode is maintained in the floating state, at least during the period from the time t7 (the second time point (2)) to immediately after the time t12 (the fifth time point (5)). Here, the time t7 is a time at which the interelectrode voltage is changed to the negative predetermined voltage to start electron accumulation, and the time t12 is a time at which the inrush current in the emitter section becomes the maximum by again changing the interelectrode voltage to the positive predetermined voltage.

Thus, unnecessary electron emission that would occur during the period in which the electrons are accumulated from the time t7 to the time t10 can be suppressed. It also becomes possible to suppress unnecessary electron emission presumably resulting from large inrush current that flows in the emitter section immediately after the time point at which the interelectrode voltage is again changed to the positive predetermined voltage to initiate electron emission at the time t11 (the fourth time point (4)).

On the other hand, at the latest, after the time t14 (the sixth time point (6)) at which the polarization reversal (positive-side polarization reversal) in the emitter section is substantially completed, the first collector voltage is applied to the collector electrode. Thus, electrons properly emitted during the period from the time t14 (the sixth time point (6)) to the time t16 (the first time point (1)) can be led to the collector electrode.

(4) A case in which the collector electrode ON time is set at a particular time within the period from the sixth time point (6) (the time t14) to immediately before the second first time point (1) (the time t16) that comes after the sixth time point (6), i.e., the period indicated by reference character D in FIG. 8. Here, the sixth time point (6) is a time at which the polarization reversal (positive-side polarization reversal) in the emitter section is substantially completed by again changing the interelectrode voltage to the positive predetermined voltage.

According to the collector electrode ON time in the case (4) above, at least during a period from the time t7 (the second time point (2)) to the time t14 (the sixth time point (6)), either the collector voltage is maintained at the second predetermined voltage by applying the second collector voltage to the collector electrode or the collector electrode is maintained in the floating state. Here, the time t7 is a time when the interelectrode voltage is changed to the negative predetermined voltage to initiate electron accumulation, and the time t14 is a time at which the polarization reversal in the emitter section is substantially completed by again changing the interelectrode voltage to the positive predetermined voltage.

Thus, unnecessary electron emission that would occur during the period when the electrons are accumulated from the time t7 to the time t10 can be suppressed. It also becomes possible to suppress unnecessary electron emission presumably resulting from large inrush current that flows in the emitter section immediately after the time point at which the Interelectrode voltage is again changed to the positive predetermined voltage to initiate electron emission at the time t11 (the fourth time point (4)). In addition, unnecessary (or excessive) electron emission generated at the start of the electron emission between the time t11 and the time t14 can be suppressed.

On the other hand, the first collector voltage can be applied to the collector electrode before the time t16 (the first time point (1)) at the latest, the time t16 being the time when the electron emission is completed. Thus, the electrons emitted properly can be led to the collector electrode. Moreover, since the first collector voltage is applied to the collector electrode substantially only during the designed electron emission period, excessive electron emission can be most effectively suppressed.

(5) A case in which the collector electrode ON time is set at a particular time within a period between the sixth time point (6) (the time t14) and a seventh time point (7) (a time t15), i.e., the period indicated by reference character E in FIG. 8, the sixth time point (6) being a time at which the polarization reversal in the emitter section is substantially completed by again changing the interelectrode voltage to the positive predetermined voltage, and the seventh time point (7) being a time at which the amount of the electrons emitted from the emitter section and reaching the collector electrode 18 reaches the maximum per unit time.

According to the collector electrode ON time in the case (5) above, at least during a period from the time t7 (the second time point (2)) to the time t14 (the sixth time point (6)), either the collector voltage is maintained at the second predetermined voltage by applying the second collector voltage to the collector electrode or the collector electrode is maintained in the floating state. Here, the time t7 is a time when the interelectrode voltage is changed to the negative predetermined voltage to initiate electron accumulation, and the time t14 is a time at which the polarization reversal in the emitter section is substantially completed by again changing the Interelectrode voltage to the positive predetermined voltage.

Thus, unnecessary electron emission that would occur during the period when the electrons are accumulated from the time t7 to the time t10 can be suppressed. It also becomes possible to suppress unnecessary electron emission presumably resulting from large inrush current that flows in the emitter section immediately after the time point at which the interelectrode voltage is again changed to the positive predetermined voltage to initiate electron emission at the time t11 (the fourth time point (4)). In addition, unnecessary (or excessive) electron emission generated at the start of the electron emission between the time t11 and the time t14 can be suppressed.

On the other hand, at the latest, after the time t15 (the seventh time point (7)) at which the amount of the electrons emitted from the upper electrode and reaching the collector electrode (i.e., the current flowing the collector electrode) per unit time reaches the maximum, the first collector voltage is applied to the collector electrode. Thus, only the electrons properly emitted can be more securely led to the collector electrode. In other words, it become possible to securely obtain a required amount of electrons emitted while avoiding excessive electron emission.

(6) A case in which the collector electrode ON time is set at a time point at which the actual potential difference between the lower and upper electrodes (the element voltage) reaches a predetermined threshold voltage Vth after the interelectrode voltage is again changed to the positive predetermined voltage (refer to the time point indicated by reference character F In FIG. 8).

In such a case, it is preferable to select the threshold voltage Vth appropriately such that the collector electrode ON time comes between the sixth time point (6) and the seventh time point (7).

For example, when the electron-emitting apparatus is applied to a display or the like, the amount of the electrons to be emitted (i.e., the amount of electrons to be accumulated in the emitter section of each element) changes according to the images to be displayed. Thus, even in case where the same positive predetermined voltage is applied between the lower electrode and the upper electrode, the change in potential difference between the lower and upper electrodes varies depending on the image to be displayed. In particular, when the electron-emitting apparatus includes two or more elements, the change in amount of electrons to be emitted varies significantly; thus, the change in potential difference between the lower and upper electrodes also significantly changes depending on the image to be displayed.

Therefore, as in case (6), if the collector electrode ON time is set at the time point at which the actual potential difference between the lower and upper electrodes reaches the predetermined threshold voltage Vth, the voltage applied to the collector electrode or the state of the collector electrode can be changed at an optimum timing despite the change in potential difference between the upper and lower electrodes. Here, the optimum timing is one that can suppress unnecessary electron emission while leading as many properly emitted electrons as possible toward the collector electrode.

This type of electron-emitting apparatus usually includes a plurality of elements. In such a case, the drive voltage applying means may be configured such that the interelectrode voltage of each element is consecutively (sequentially) changed to the negative predetermined voltage, and then the interelectrode voltage of all the elements is simultaneously changed to the positive predetermined voltage so that electrons are simultaneously emitted from all of the elements.

According to this structure, electrons are separately and consecutively (sequentially) accumulated in the respective elements in amounts required by the pixels constituted from the elements, and are emitted from all the elements simultaneously to match the display timing of moving pictures and the like. Thus, no element accumulates electrons while the other elements are emitting electrons.

Here, the collector voltage applying means may be configured such that it resumes to apply the first collector voltage to the collector electrode after the time point at which the electron accumulation is completed by the element whose interelectrode voltage is changed to the negative predetermined voltage at the latest timing among the elements. In such a case, one collector electrode may be provided for each of the elements so as to be opposed to the upper electrode of the corresponding element, and these collector electrodes may be maintained at the same potential by being connected through a conducting wire (wires). Alternatively, the collector electrode may be a single electrode layer opposed to the upper electrodes of all the elements.

According to this structure, the collector voltage applying means requires only one switching element. Thus, the collector voltage applying means becomes inexpensive and achieves high reliability.

DESCRIPTION OF THE PREFERRED EMBODIMENTS

Electron-emitting apparatuses according to the preferred embodiments of the present invention will now be described with reference to the drawings. The electron-emitting apparatus is applicable to electron beam irradiators, light sources, manufacturing apparatuses for electronic components, and the like. In the description below, the electron-emitting apparatuses are applied to displays.

First Embodiment

Structure

Figure 1:
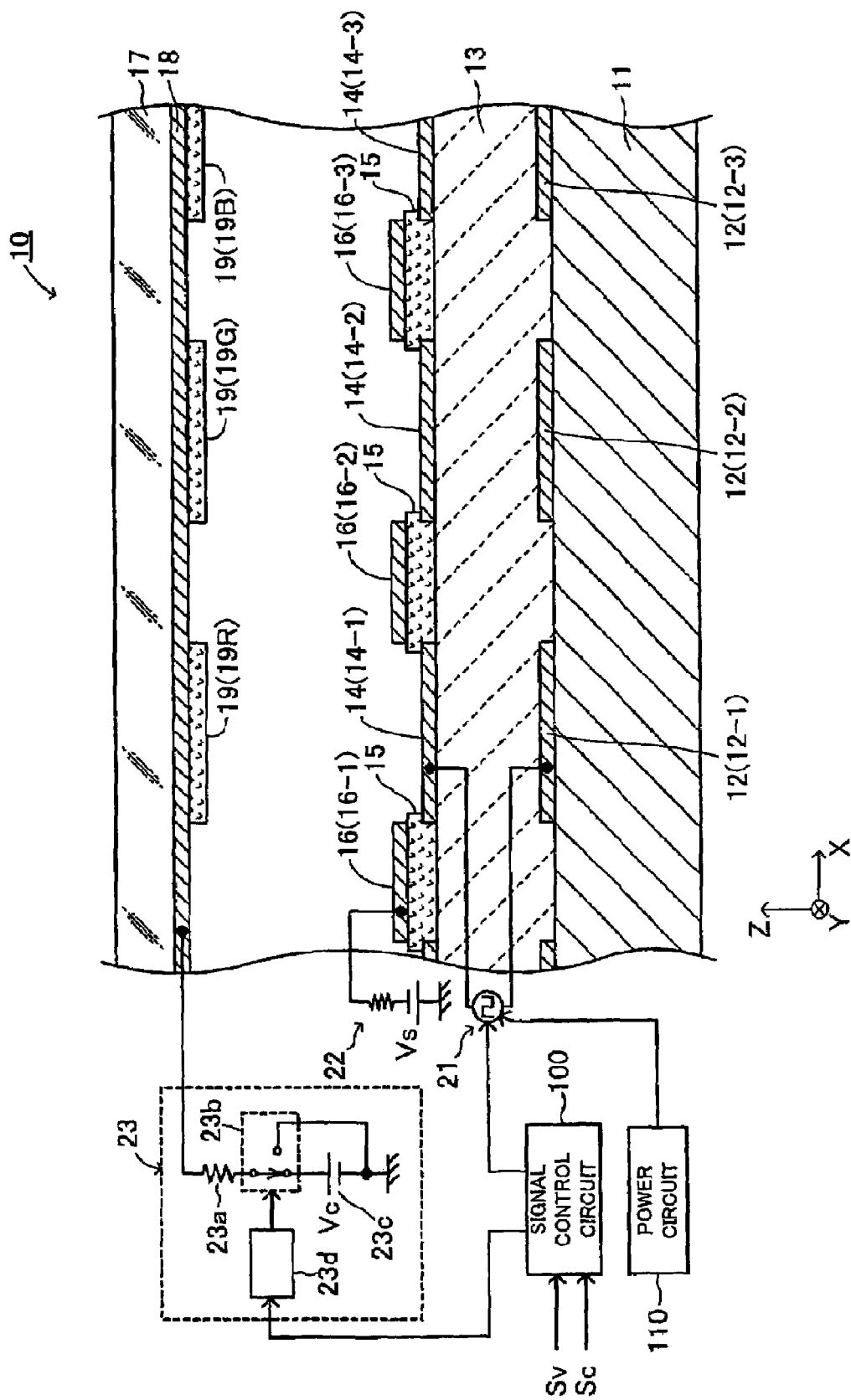
FIG. 1 is a partial cross-sectional view of an electron-emitting apparatus according to a first embodiment of the present invention.
Figure 2:
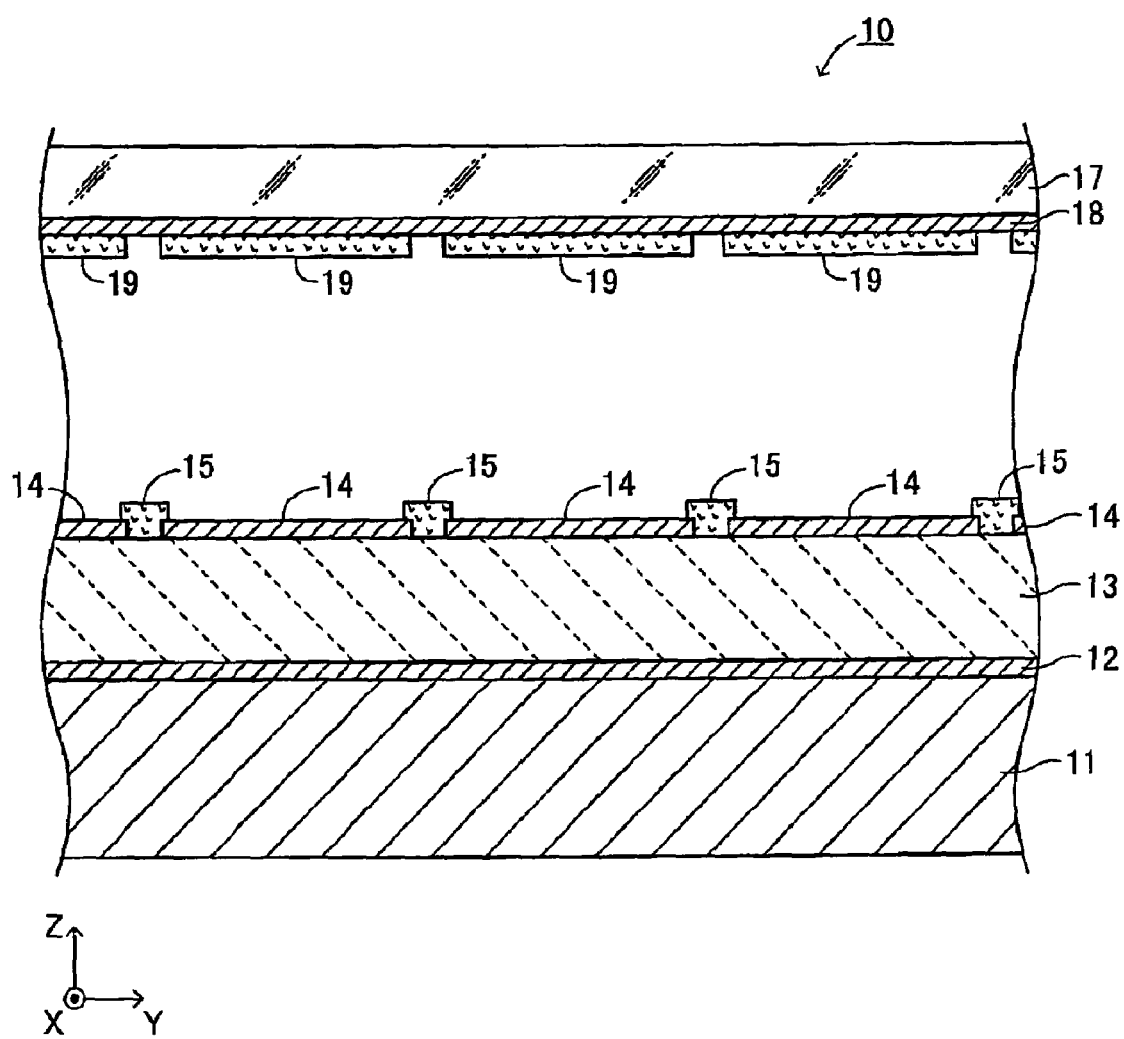
FIG. 2 is a partial cross-sectional view of the electron-emitting apparatus shown in FIG. 1, taken along a different plane.
Figure 3:
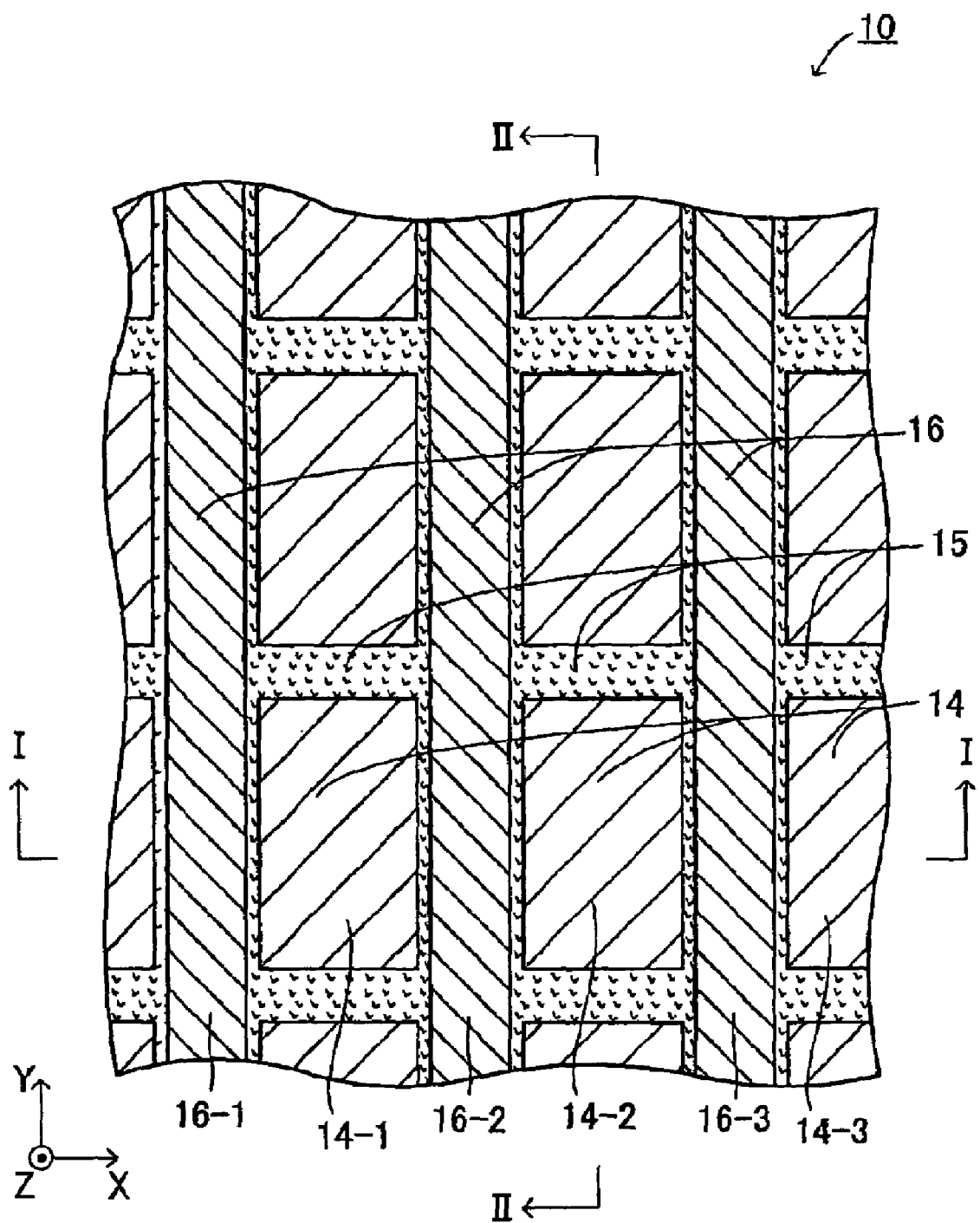
FIG. 3 is a partial plan view of the electron-emitting apparatus shown in FIG. 1.

As shown in FIGS. 1 to 3, an electron emitting apparatus (an electron emitting device) 10 according to a first embodiment of the present invention includes a substrate 11, a plurality of lower electrodes (lower electrode layers) 12, an emitter section 13, a plurality of upper electrodes (upper electrode layers) 14, insulating layers 15, and focusing electrodes (focusing electrode layers, a bundling electrode to bundle emitted electrons) 16. FIG. 1 is a cross-sectional view of the electron emitting apparatus 10 taken along line I-I in FIG. 3, which is a partial plan view of the electron emitting apparatus 10. FIG. 2 is a cross-sectional view of the electron emitting apparatus 10 taken along line II-II in FIG. 3.

The substrate 11 is a thin plate having an upper surface and a lower surface parallel to the plane (X-Y plane) defined by the X axis and the Y axis perpendicular to each other. The thickness direction of the substrate 11 is the Z-axis direction perpendicular to both the X and Y axes. The substrate 11 is mainly made of zirconium oxide, e.g., glass or ceramic.

Each of the lower electrodes 12 is a layer made of a conductive material, e.g., silver or platinum in this embodiment, and is disposed (formed) on the upper surface of the substrate 11. In a plan view, each lower electrode 12 has a shape of a strip, the longitudinal direction of which is the Y-axis direction. As shown in FIG. 1, the adjacent two lower electrodes 12 are apart from each other by a predetermined distance in the X-axis direction. Note that in FIG. 1, the lower electrodes 12 represented by reference numerals 12-1, 12-2, and 12-3 are respectively referred to as a first lower electrode, a second lower electrode, and a third lower electrode for the convenience sake.

The emitter section 13 is made of a dielectric material having a high relative dielectric constant, for example, a three-component material PMN-PT-PZ composed of lead magnesium niobate (PMN), lead titanate (PT), and lead zirconate (PZ). Materials for the emitter section 13 will be described in greater detail below. The emitter section 13 is disposed (formed) on the upper surfaces of the substrate 11 and lower electrodes 12. The emitter section 13 is a thin plate similar to the substrate 11. As shown in an enlarged view in FIG. 4, the upper surface of the emitter section 13 has irregularities (asperity) 13a formed by the grain boundaries of the dielectric material.

Figure 4:
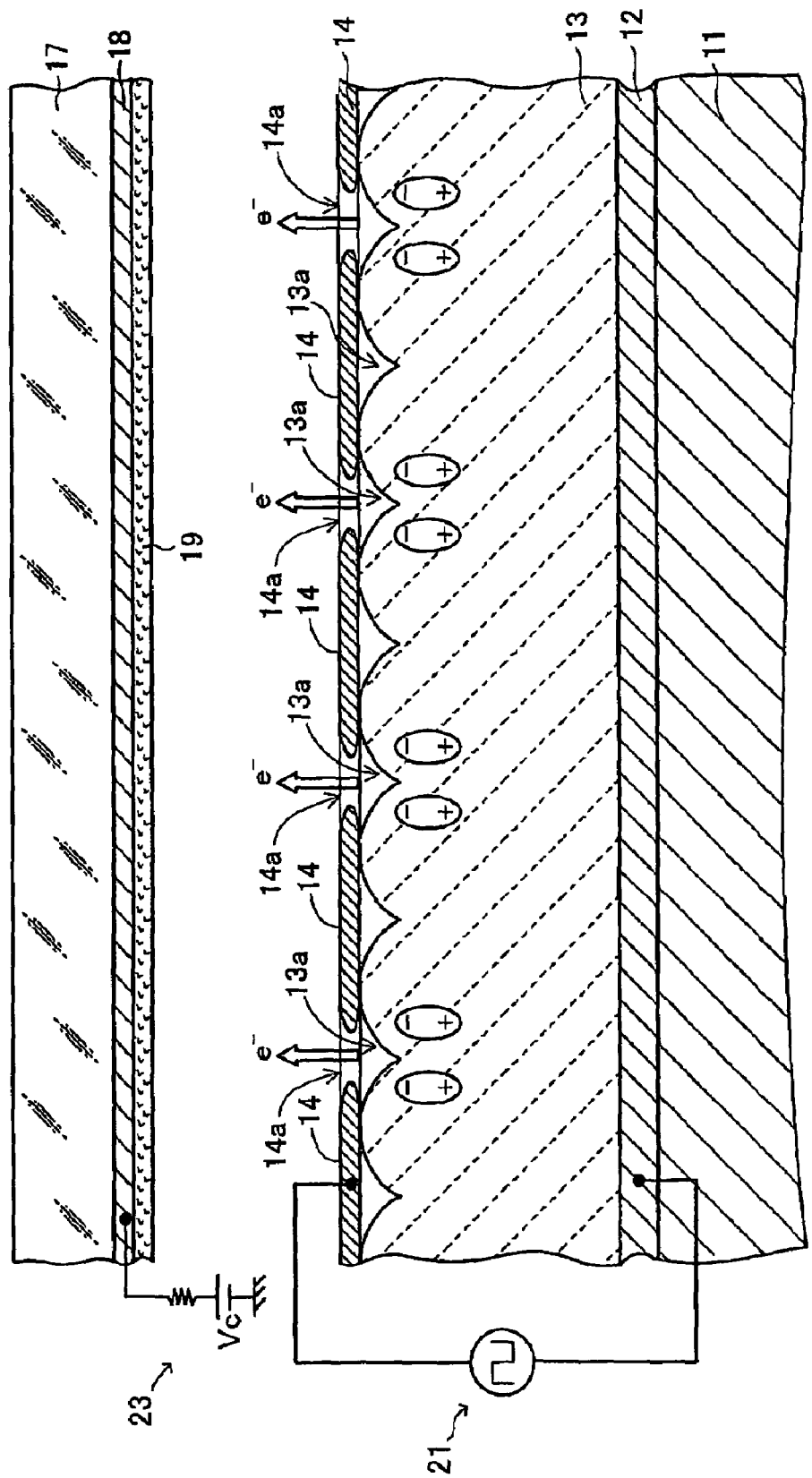
FIG. 4 is an enlarged partial cross-sectional view of the electron-emitting apparatus shown in FIG. 1.
Figure 5:
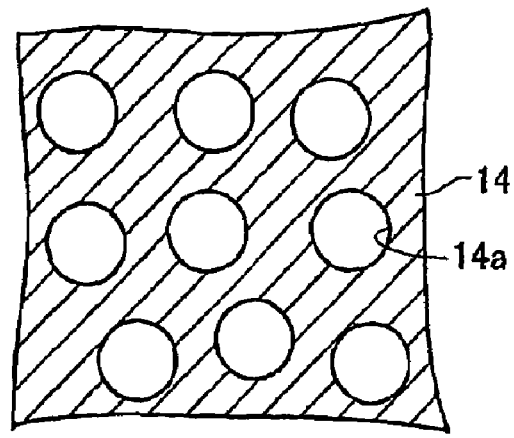
FIG. 5 is an enlarged partial plan view of an upper electrode shown In FIG. 1.

Each of the upper electrodes 14 is a layer made of a conductive material, i.e., platinum in this embodiment, and is disposed (formed) on the upper surface of the emitter section 13. As shown in a plan view of FIG. 3, each upper electrode 14 has a shape of a rectangle having a short side and a long side respectively lying in the X-axis direction and the Y-axis direction. The upper electrodes 14 are apart from one another and are arranged into a matrix. Each upper electrode 14 is opposed to the corresponding lower electrode 12. In a plan view, the upper electrode 14 is disposed at a position that overlaps the corresponding lower electrode 12. Furthermore, as shown in FIG. 4 and FIG. 5, which is a partial enlarged view of the upper electrode 14, each upper electrode 14 has a plurality of micro through holes 14a. Note that in FIGS. 1 and 3, the upper electrodes 14 represented by reference numerals 14-1, 14-2, and 14-3 are respectively referred to as a first upper electrode, a second upper electrode, and a third upper electrode for the convenience sake. The upper electrodes 14 aligned in the same row with respect to the X-axis direction (i.e., in the same row extending along the Y-axis direction) are connected to one another by a layer (not shown) made of a conductor and are maintained at the same electric potential.

The lower electrodes 12, the emitter section 13, and the upper electrodes 14 made of a platinum resinate paste are monolithically integrated by firing (baking). As a result of the firing, the upper electrode 14 shrinks and its thickness of the upper electrode 14 reduces, for example, from 10 µm to 0.1 µm. As a result, the micro through holes 14a are formed in the upper electrode 14.

The portion where an upper electrode 14 overlaps a corresponding lower electrode 12 in a plan view forms one (independent) element for emitting electrons. For example, the first lower electrode 12-1, the first upper electrode 14-1, and the portion of the emitter section 13 sandwiched between the first lower electrode 12-1 and the first upper electrode 14-1 form a first element. The second lower electrode 12-2, the second upper electrode 14-2, and the portion of the emitter section 13 sandwiched between the second lower electrode 12-2 and the second upper electrode 14-2 form a second element. The third lower electrode 12-3, the third upper electrode 14-3, and the portion of the emitter section 13 sandwiched between the third lower electrode 12-3 and the third upper electrode 14-3 form a third element. In this manner, the electron-emitting apparatus 10 includes a plurality of independent electron-emitting elements.

The insulating layers 15 are disposed (formed) on the upper surface of the emitter section 13 so as to fill the gaps between the upper electrodes 14. The thickness (the length in the Z-axis direction) of each insulating layer 15 is slightly larger than the thickness (the length in the Z-axis direction) of each upper electrode 14. As shown in FIGS. 1 and 2, the end portions of each insulating layer 15 in the X-axis direction and the Y-axis direction cover the end portions of the upper electrodes 14 in the X-axis and Y-axis directions, respectively.

Each of the focusing electrodes 16 is a layer made of a conductive material, i.e., silver in this embodiment, and are disposed (formed) on each of the insulating layers 15. As shown in a plan view of FIG. 3, each focusing electrode 16 has a shape of a strip whose longitudinal direction is the Y-axis direction. Each focusing electrode 16 is disposed (formed) between the adjacent upper electrodes 14 in the X-axis direction in the plan view. In detail, each focusing electrode 16 is disposed between the upper electrodes of the elements adjacent to each other in the X-axis direction and is slightly obliquely above the upper electrodes. All the focusing electrodes 16 are connected to one another by a layer (not shown) made of a conductor and maintained at the same potential.

In FIGS. 1 and 3, the focusing electrodes 16 represented by reference numerals 16-1, 16-2, and 16-3 are respectively referred to as a first focusing electrode, a second focusing electrode, and a third focusing electrode for the convenience sake. The second focusing electrode 16-2 lies between the first upper electrode 14-1 of the first element and the second upper electrode 14-2 of the second element and is located obliquely above the first and second upper electrodes 14-1 and 14-2. Similarly, the third focusing electrode 16-3 is between the second upper electrode 14-2 of the second element and the third upper electrode 14-3 of the third element and is located obliquely above the second and third upper electrodes 14-2 and 14-3.

The electron emitting apparatus 10 further includes a transparent plate 17, a collector electrode (collector electrode layer) 18, and phosphors 19.

The transparent plate 17 is made of a transparent material (glass or acrylic resin in this embodiment), and is disposed above the upper electrodes 14 so that the transparent plate 17 is apart from the upper electrodes 14 in the positive direction of the Z axis by a predetermined distance. The upper and lower surfaces of the transparent plate 17 are parallel to the upper surfaces of the emitter section 13 and the upper electrodes 14, and lie in the X-Y plane.

The collector electrode 18 is made of a conductive material. In this embodiment, the collector electrode 18 is a transparent conductive film made of indium tin oxide (ITO) and is formed as a layer covering the entire lower surface of the transparent plate 17. In other words, the collector electrode 18 is disposed above the upper electrodes 14 and is opposed to the upper electrodes 14.

Each phosphor 19 emits red, green, or blue light by the collision of electrons. In a plan view, each phosphor 19 has substantially the same shape as that of the upper electrode 14 and overlaps the corresponding upper electrode 14. In FIG. 1, the phosphors 19 represented by reference numerals 19R, 19G, and 19B respectively emit red, green, and blue light. In this embodiment, the red phosphor 19R is disposed directly above the first upper electrode 14-1 (i.e., in the positive direction of the Z axis), the green phosphor 19G is disposed directly above the second upper electrode 14-2, and the blue phosphor 19B is disposed directly above the third upper electrode 14-3. The space surrounded by the emitter section 13, the upper electrodes 14, the insulating layers 15, the focusing electrodes 16, and the transparent plate 17 (the collector electrode 18) is maintained under substantial vacuum of preferably $10^2$ to $10^{-6}$ Pa and more preferably $10^{-3}$ to $10^{-5}$ Pa.

In other words, the side walls (not shown) of the electron emitting apparatus 10, the transparent plate 17, and the collector electrode 18 serve as the members for defining a hermetically closed space (an enclosed space), and this hermetically closed space is maintained under substantial vacuum. The elements (at least the upper part of the emitter section 13 and the upper electrode 14 of each element) of the electron emitting apparatus 10 are disposed inside the hermetically closed space under substantial vacuum.

As shown in FIG. 1, the electron emitting apparatus 10 further includes a drive voltage applying circuit (drive voltage applying means or potential difference applying means) 21, a focusing electrode potential applying circuit (focusing electrode potential difference applying means) 22, and a collector voltage applying circuit (collector voltage applying means) 23.

The drive voltage applying circuit 21 is connected to the upper electrodes 14, the lower electrodes 12, a signal control circuit 100, and a power circuit 110. The drive voltage applying circuit 21 applies pulsed drive voltage Vin (described in detail below) between each pair of the lower electrode 12 and the upper electrode 14 facing to each other based on the signal received from the signal control circuit 100. The focusing electrode potential applying circuit 22 is connected to the focusing electrodes 16 and constantly applies a predetermined negative potential (voltage) Vs to the focusing electrodes 16.

The collector voltage applying circuit 23 applies a predetermined voltage (collector voltage) to the collector electrode 18 and includes a resistance 23a, a switching element 23b, a constant voltage source 23c for generating a predetermined voltage Vc, and a switch control circuit 23d. One end of the resistance 23a is connected to the collector electrode 18. The other end of the resistance 23a is connected to a fixed connection point of the switching element 23b. The switching element 23b is a semiconductor element, such as MOS-FET, and is connected to the switch control circuit 23d.

The switching element 23b has two switching points in addition to the above-described fixed connection point. In response to the control signal from the switch control circuit 23d, the switching element 23b selectively couples the fixed connection point to one of the two switching points. One of the two switching points is grounded, and the other is connected to the anode of the constant voltage source 23c. The cathode of the constant voltage source 23c is earthed. The switch control circuit 23d is connected to the signal control circuit 100, and controls the switching operation of the switching element 23b based on the signal received from the signal control circuit 100. Moreover, the switch control circuit 23d includes an element voltage measuring circuit and a detector circuit for detecting completion of electron emission, which will be described below.

Principle and Operation of Electron Emission

The principle of the electron emission of the electron emitting apparatus 10 having the above-described structure will now be explained.

Figure 6:
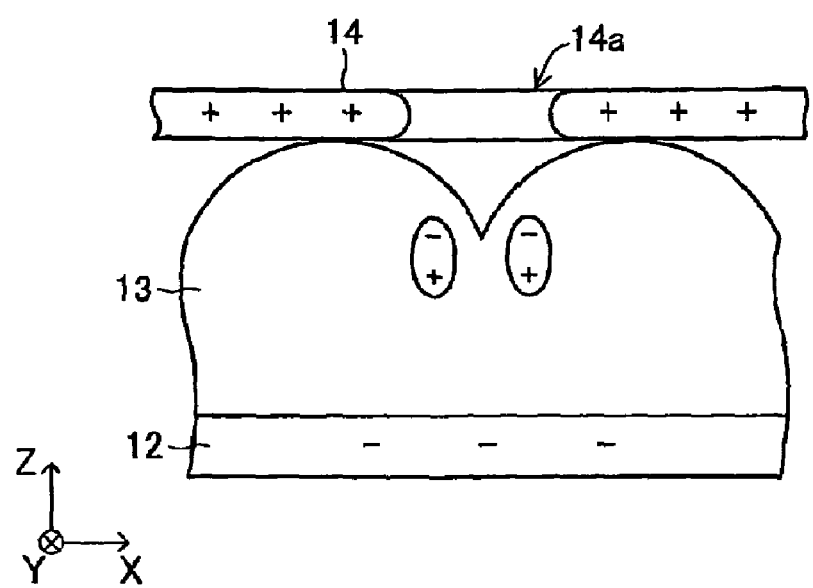
FIG. 6 shows a state of the electron-emitting apparatus shown in FIG. 1.
Figure 7:
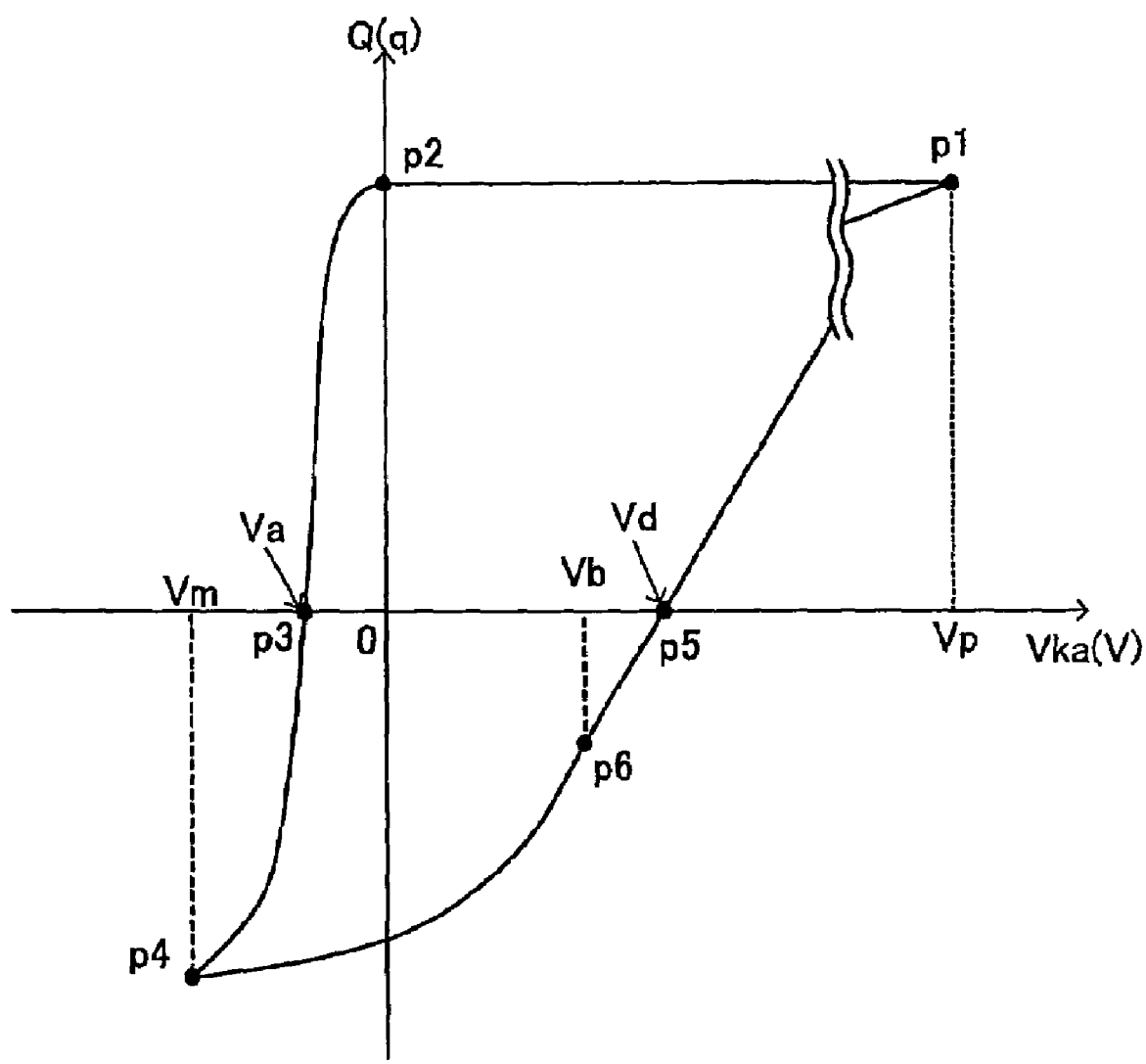
FIG. 7 is a graph indicating the voltage-polarization characteristic of an emitter section shown in FIG. 1.

First, the state is described with reference to FIG. 6 in which the actual potential difference Vka. (element voltage Vka) between the lower electrode 12 and the upper electrode 14 with reference to the lower electrode 12 is maintained at a predetermined positive voltage Vp and in which all the electrons in the emitter section 13 have been emitted without remaining in the emitter section 13. At this stage, the negative pole of the dipole in the emitter section 13 is oriented toward the upper surface of the emitter section 13, i.e., oriented in the positive direction of the Z axis toward the upper electrode 14. This state is observed at a point p1 on the graph In FIG. 7. The graph in FIG. 7 shows the voltage-polarization characteristic of the emitter section 13 and has the abscissa indicating the element voltage Vka and the ordinate indicating the charge Q near the upper electrode 14.

Figure 8:
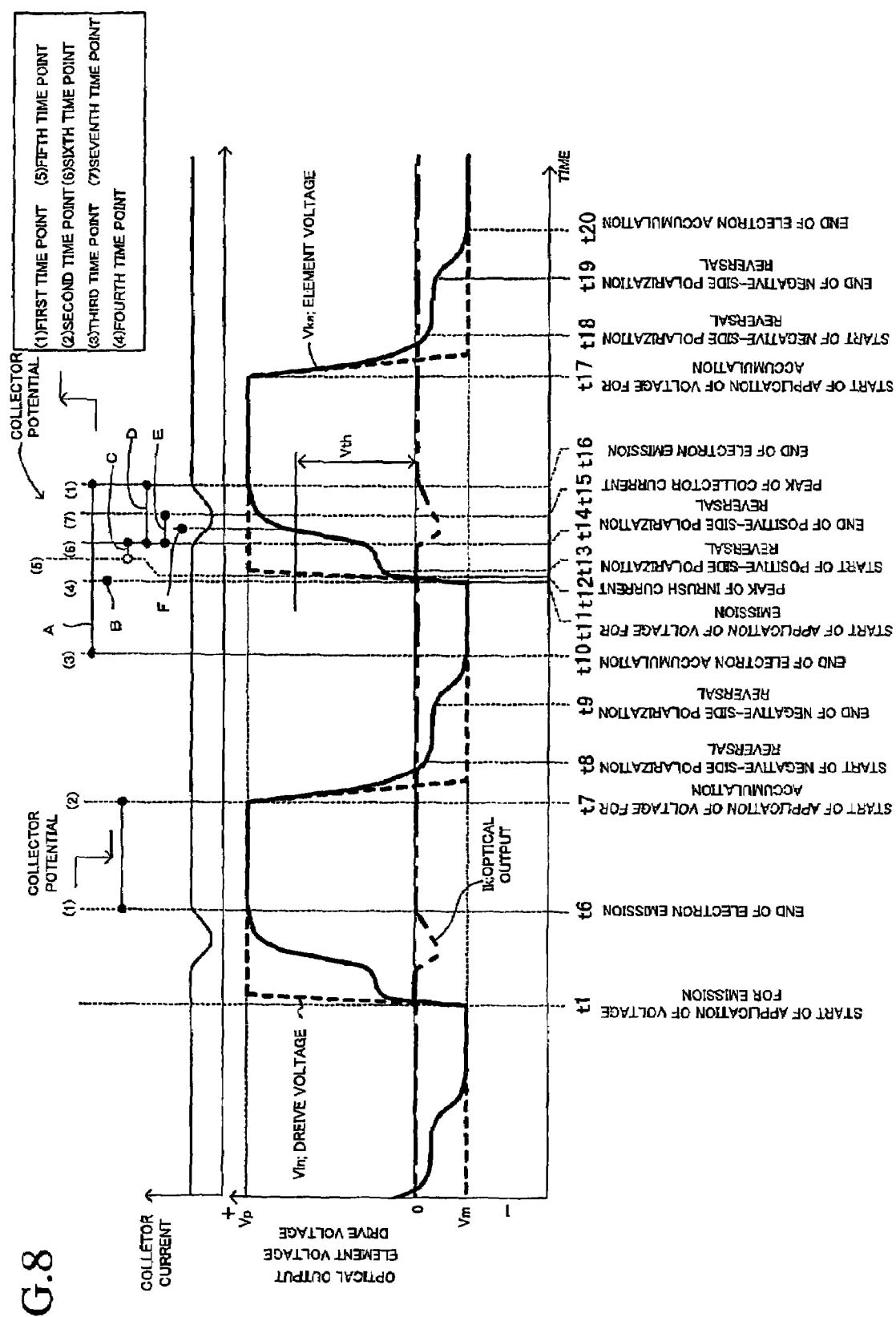
FIG. 8 is a time chart showing drive voltage, element voltage, optical output (value of current obtained by converting the emitted light), and collector current of the electron-emitting apparatus show in FIG. 1 and electron-emitting apparatuses of other embodiments.
Figure 9:
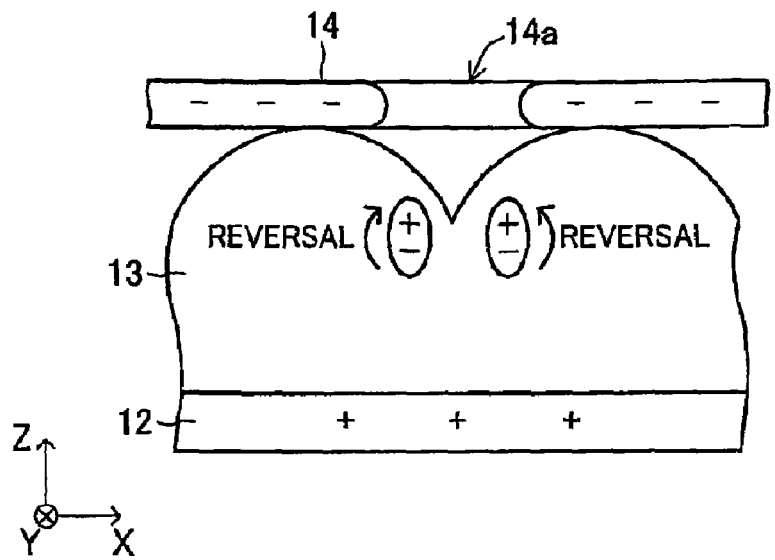
FIG. 9 shows yet another state of the electron-emitting apparatus shown in FIG. 1.
Figure 10:
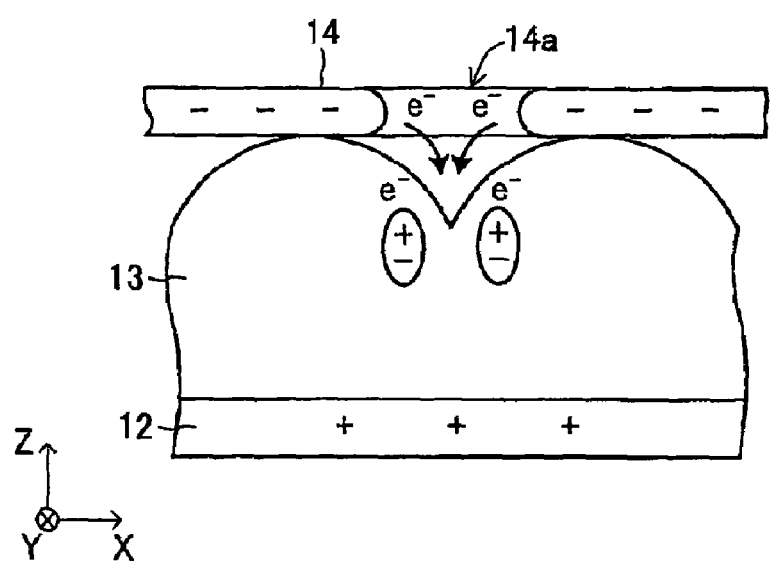
FIG. 10 shows yet another state of the electron-emitting apparatus shown in FIG. 1.

The drive voltage applying circuit 21 then changes the drive voltage Vin to a predetermined negative voltage Vm at a time t7 shown in FIG. 8. By this operation, the element voltage Vka decreases toward a point p3 via a point p2 in FIG. 7. Once the element voltage Vka is decreased to near the negative coercive field voltage Va shown in FIG. 7, the orientation of the dipoles in the emitter section 13 starts reversing. In other words, the polarization reversal (negative-side polarization reversal) starts from this point, as shown in FIG. 9. The polarization reversal increases the electric field in the contact sites (triple junctions) between the upper surface of the emitter section 13, the upper electrodes 14, and the ambient medium (in this embodiment, vacuum) and/or the electric field at the distal end portions of the upper electrodes 14 forming the micro through holes 14a. In other words, electrical field concentration occurs at these sites. As a result, as shown in FIG. 10, the electrons are started to be supplied toward the emitter section 13 from the upper electrodes 14.

The released electrons are accumulated mainly in the upper part of the emitter section 13 near the region exposed through the micro through hole 14a and near the distal end portions of the upper electrode 14 that define the micro through hole 14a. This portion where the electrons are accumulated is hereinafter simply referred to as the region "near the micro through hole 14a". Subsequently, at a time t9 in FIG. 8, the negative-side polarization reversal is completed, and the element voltage Vka dramatically changes toward the predetermined negative voltage Vm. The element voltage Vka reaches the predetermined negative voltage Vm at a time t10. Thus, electron accumulation is completed, i.e., a saturation state of electron accumulation is reached. This state is observed at a point p4 in FIG. 7.

Figure 11:
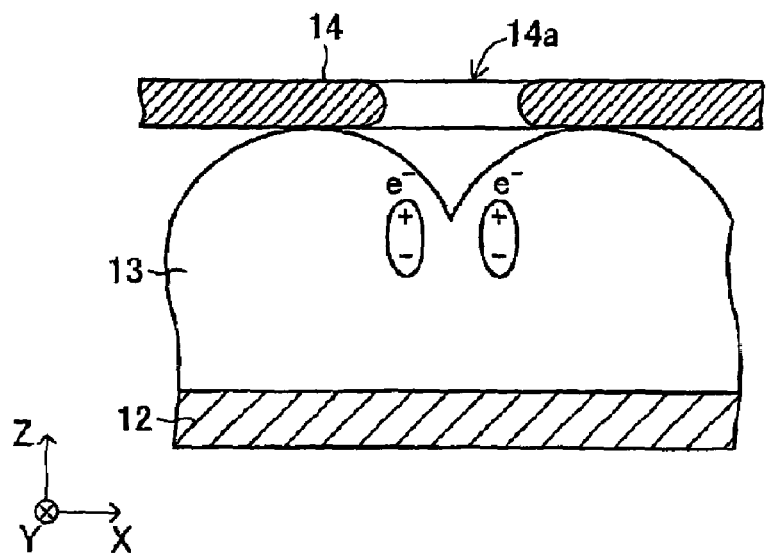
FIG. 11 shows still another state of the electron-emitting apparatus shown in FIG. 1.
Figure 12:
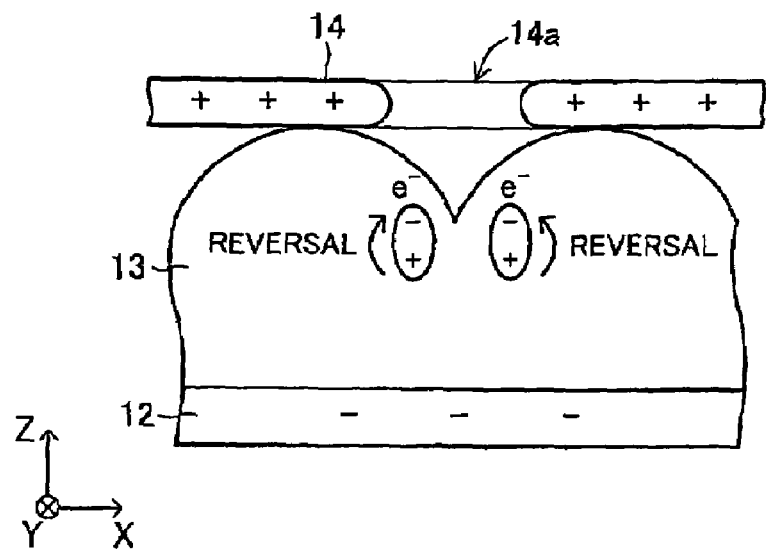
FIG. 12 shows another state of the electron-emitting apparatus shown in FIG. 1.

The drive voltage applying circuit 21 then changes the drive voltage Vin to a predetermined positive voltage Vp at a time t11 shown in FIG. 8. By this operation, the element voltage Vka starts to increase. Until the element voltage Vka becomes the voltage Vb (point p6) slightly smaller than the positive coercive field voltage Vd corresponding to a point p5 in FIG. 7, the charge state of the emitter section 13 is maintained, as shown in FIG. 11. Subsequently, the element voltage Vka reaches a value near the positive coercive field voltage Vd at a time t13 shown in FIG. 8. This allows the negative poles of the dipoles to orient toward the upper surface of the emitter section 13. In other words, as shown in FIG. 12, the polarization reversal starts for the second time, i.e., the positive-side polarization reversal is initiated. This state is observed near the point p5 in FIG. 7.

Figure 13:
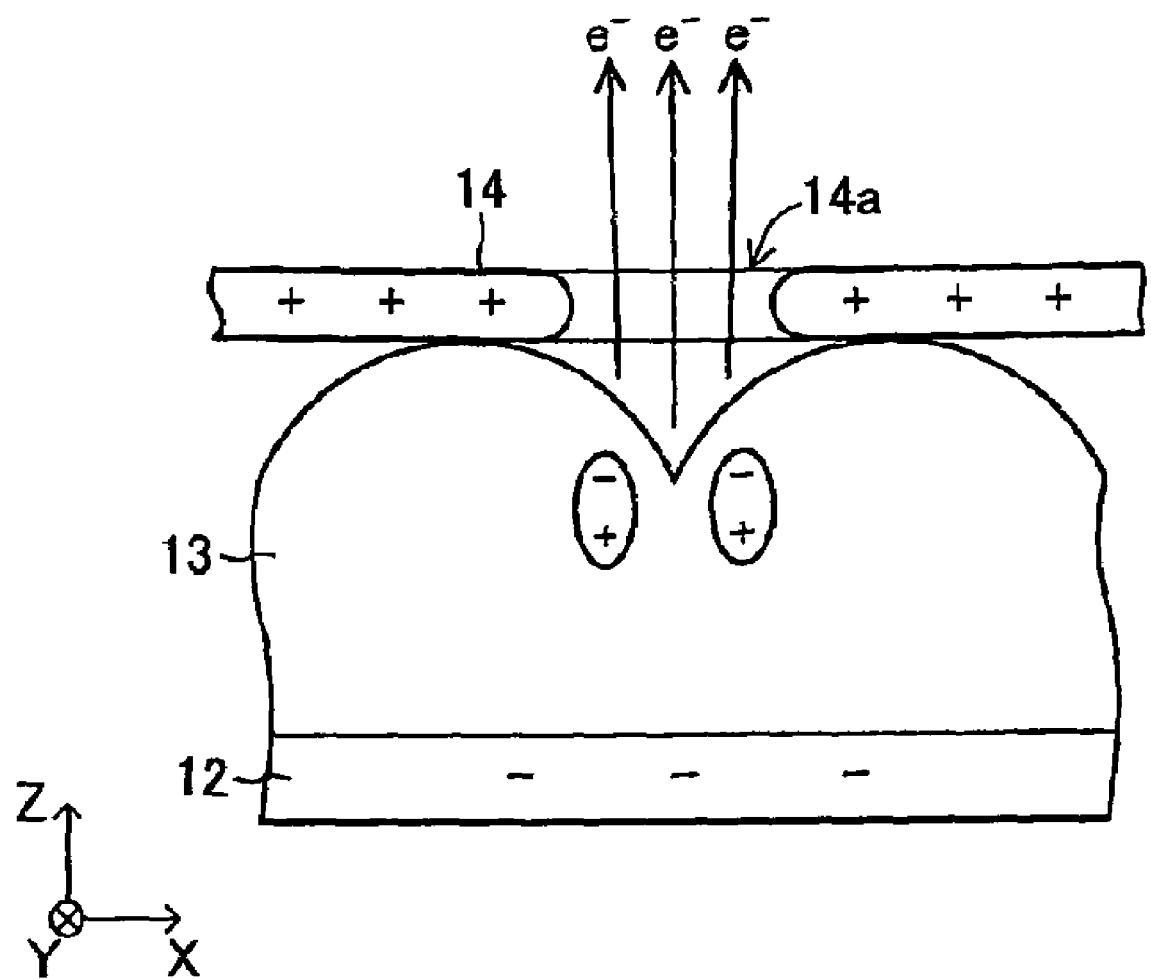
FIG. 13 shows yet another state of the electron-emitting apparatus shown in FIG. 1.

Subsequently, at a time near a time t14 in FIG. 8 at which the positive-side polarization reversal is completed, the number of the dipoles having negative poles oriented toward the upper surface of the emitter section 13 increases. As a result, as shown in FIG. 13, the electrons accumulated near the micro through holes 14a are started to be emitted in the upward direction (the positive direction of the Z axis) through the micro through holes 14a by Coulomb repulsion.

Upon completion of the positive-side polarization reversal at time t14 in FIG. 8, the element voltage Vka starts to increase rapidly, and electrons are actively emitted. At a time t16, electron emission is completed, and the element voltage Vka reaches the positive predetermined voltage Vp. As a result, the state of the emitter section 13 is returned to its initial state shown in FIG. 6 observed at the point p1 in FIG. 7. This summarizes the principle of a series of operation including electron accumulation (light OFF state) and electron emission (light ON or emission state).

The drive voltage applying circuit 21 sets the drive voltage Vin of only the upper electrodes 14 from which electron emission is required at the predetermined negative voltage Vm to accumulate electrons, and maintains the drive voltage Vin of upper electrodes 14 from which no electron emission is required at zero. Subsequently, the drive voltage applying circuit 21 simultaneously sets the drive voltage of all of the upper electrodes 14 at the predetermined positive value Vp. According to this arrangement, electrons are emitted from the upper electrodes 14 (the micro through holes 14a) of only the elements in which electrons have been accumulated in the emitter section 13. Thus, no polarization reversal occurs in the portions of emitter section 13 near the upper electrodes 14 from which no electron emission is required.

Figure 14:
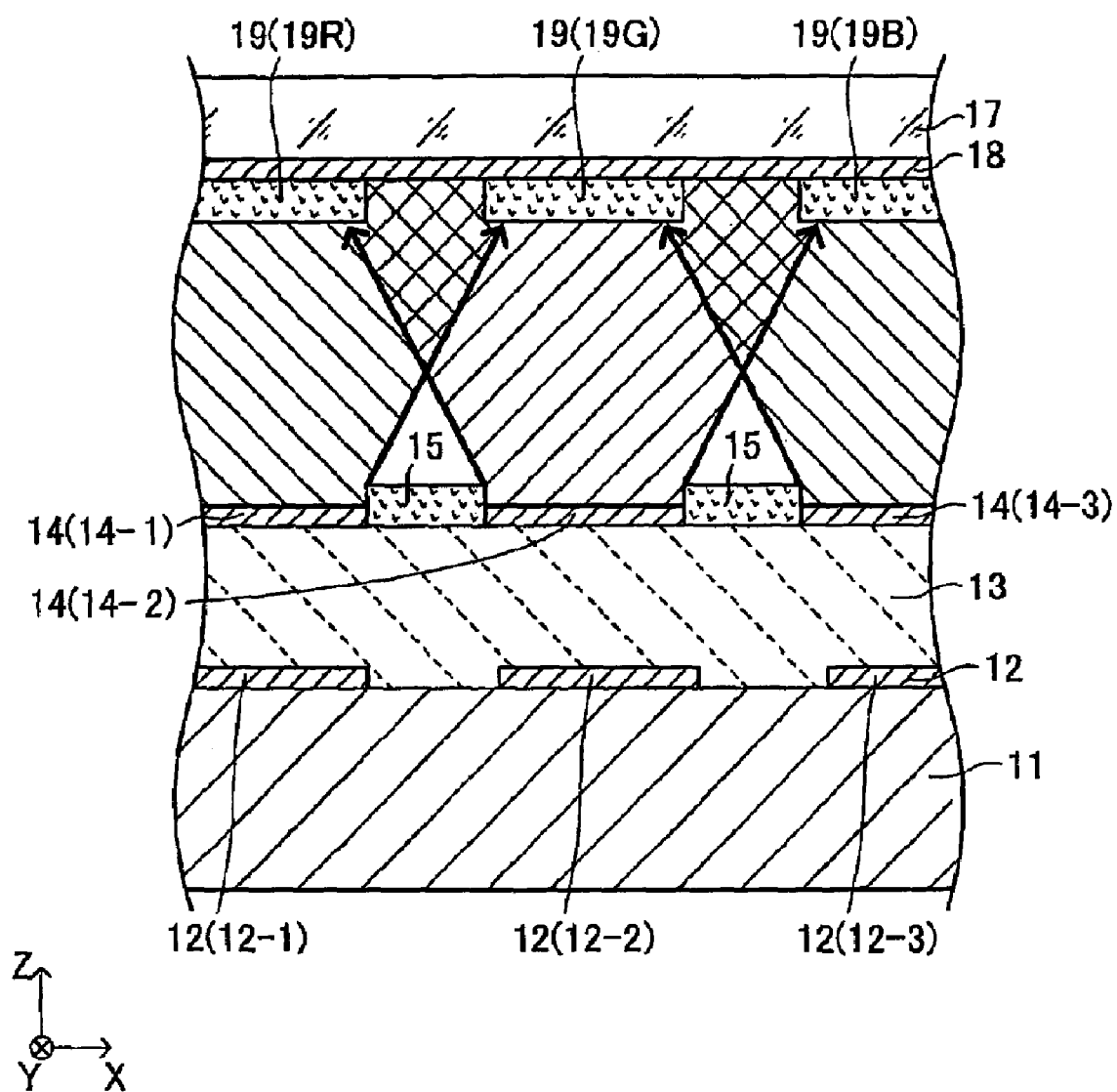
FIG. 14 is a diagram showing electron emission from an electron-emitting apparatus having no focusing electrode.

When electrons are emitted through the micro through holes 14a of the upper electrodes 14, the electrons travel in the positive direction of the Z axis by spreading into the shape of a cone, as shown in FIG. 14. Thus, in an apparatus of the related art, electrons emitted from one upper electrode 14, e.g., the second upper electrode 14-2, reach not only the phosphor 19, e.g., the green phosphor 19G, directly above that upper electrode 14 but also the phosphors 19, e.g., the red phosphor 19R and the blue phosphor 19B, adjacent to this phosphor 19. This decreases color purity and sharpness of images.

Figure 15:
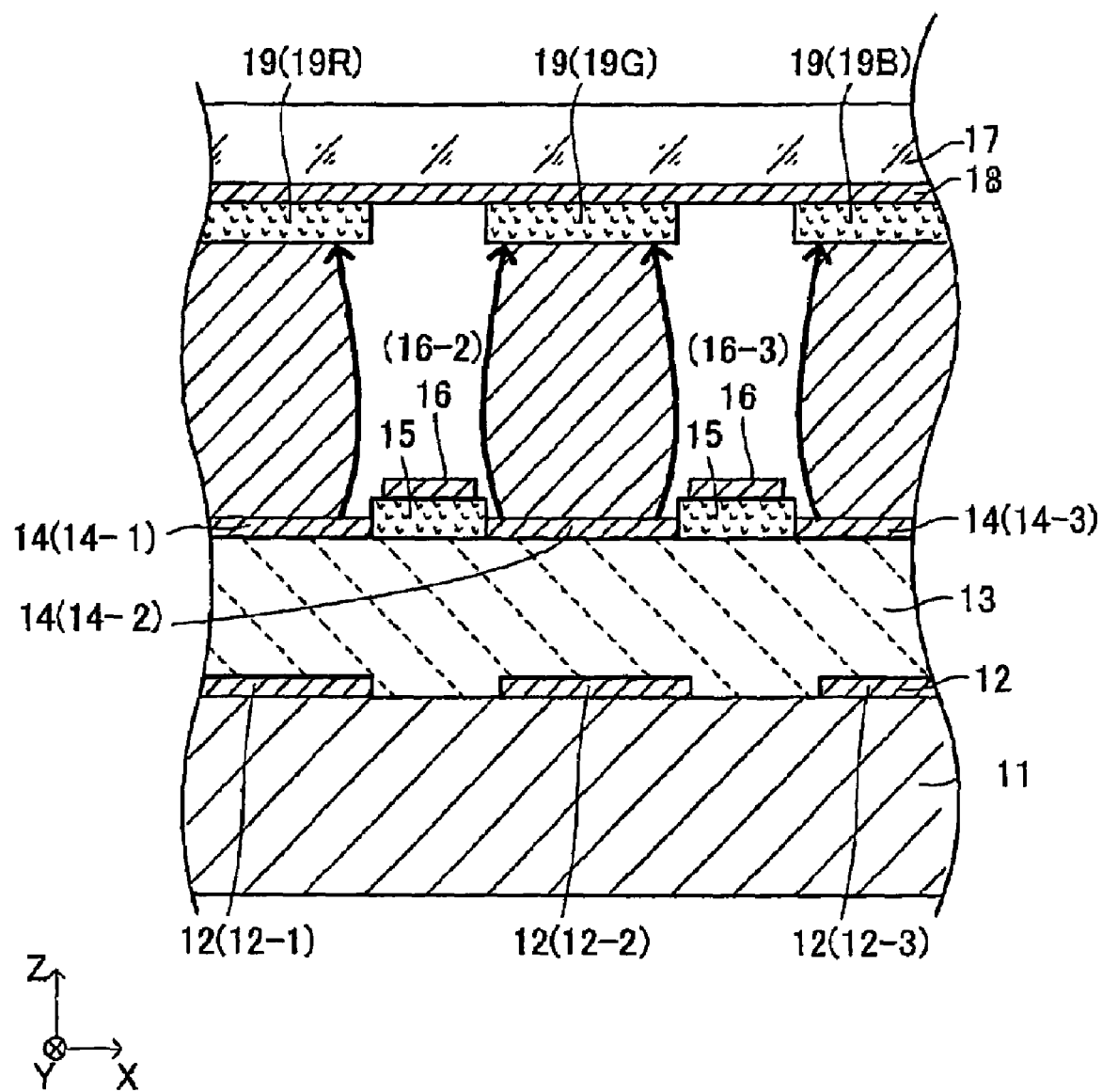
FIG. 15 is a diagram showing electron emission from the electron-emitting apparatus shown in FIG. 1.

In contrast, the electron emitting apparatus 10 of this embodiment has focusing electrodes 16 to which a negative potential is applied. Each focusing electrode 16 is interposed between the adjacent upper electrodes 14 (i.e., between the upper electrodes of the adjacent elements) and is disposed at a position slightly above the upper electrodes 14. Thus, as shown in FIG. 15, the electrons emitted from the micro through holes 14a travel substantially directly upward without spreading owing to the electric field generated by the focusing electrode 16.

As a result, the electrons emitted from the first upper electrode 14-1 reach only the red phosphor 19R, the electrons emitted from the second upper electrode 14-2 reach only the green phosphor 19G, and the electrons emitted from the third upper electrode 14-3 reach only the blue phosphor 19B. Thus, the color purity of the display does not decrease, and sharper images can be obtained.

Timing of Unnecessary Electron Emission and Inferred Reason for Such Emission

In the electron emitting apparatus 10 that operates as described above, it is understood from the collector current (the amount of electrons reaching the collector electrode per unit time) shown in FIG. 8, that electron emission starts near the time t14 and reaches the maximum emission per unit time at the time t15. The electron emission is completed at the time t16. That is, during this period, proper (regular) emission is observed. However, experiments conducted by the inventors have reported that unexpected emission (unnecessary electron emission) occurs as described below.

(1) Unnecessary electron emission is observed immediately after the drive voltage (the voltage between the upper and lower electrodes) Vin is changed from the predetermined positive value Vp to the predetermined negative value Vm at the point t7 shown in FIG. 8. This may be due to a flow of large inrush current between the upper and lower electrodes 14 and 12 (i.e., the emitter section 13) caused by a rapid change in drive voltage Vin.

(2) Unnecessary electron emission is also observed immediately after the completion of the negative-side polarization reversal (the time t9 in FIG. 8). This may be due to a rapid change in element voltage Vka (an excessively large ratio of change in element voltage over time, or dVka/dt) after the completion of the negative-side polarization reversal in the emitter section 13.

(3) Unnecessary electron emission is also observed immediately after the time (the time t11 in FIG. 8) at which the drive voltage Vin is changed from the predetermined negative value Vm to the predetermined positive value Vp. This may be caused by a phenomenon that a large inrush current flows between the upper and lower electrodes 14 and 12 (i.e., the emitter section 13) at the time t12 with the rapid change in drive voltage Vin.

(4) Unnecessary electron emission is also observed immediately after the completion of the positive-side polarization reversal (the time t14 in FIG. 8). This may be due to a rapid change in element voltage Vka after the completion of the positive-side polarization reversal in the emitter section 13.

Control of Collector Electrode

With analysis described above, the electron-emitting apparatus 10 of the first embodiment controls the collector electrode 18 as follows.

At a particular point (timing) within the period starting from the time t6 and ending at the time t7, the collector voltage applying circuit 23 applies a second collector voltage V2 to the collector electrode 18 so that the collector voltage can change from a first predetermined voltage to a second predetermined voltage lower than the first predetermined voltage. Here, the time t6 is a first time point (1) at which electron emission through the micro through holes 14a is substantially completed by changing the interelectrode voltage (drive voltage) Vin between the upper and lower electrodes to the predetermined positive value Vp; and the time t7 is a second time point (2) at which the voltage between the upper and lower electrodes is controlled to the predetermined negative value Vm.

More specifically, the collector voltage applying circuit 23 conducts the switching operation at the particular time so that the point to be connected to the fixed connection point of the switching element 23b is switched from the switching point coupled to the constant voltage source 23c to the switching point coupled to the earthed switching point. Here, the collector voltage applying circuit 23 identifies the time at which a predetermined time has elapsed from the timing when it is detected based on the signal fed from the signal control circuit 100 that the interelectrode voltage (drive voltage) Vin changed to the predetermined positive value Vp, as the aforementioned particular time between the first time point (1) and the second time point (2), and the switching operation is conducted at this particular time.

It is noted that the switch control circuit 23d of the collector voltage applying circuit 23 may include an element voltage measuring circuit for measuring the element voltage Vka and a detector circuit for detecting the completion of electron emission. The detector circuit detects and identifies, as the first time point (1) at which the electron emission is completed, a time at which the measured element voltage Vka becomes substantially coincident with the predetermined positive voltage Vp. This collector voltage applying circuit 23 may conduct the switching operation at the particular time so that the point to be connected to the fixed connection point of the switching element 23b is switched from the switching point coupled to the constant voltage source 23c to the switching point coupled to the earthed switching point immediately after the first time point (1) detected based on the signal from the signal control circuit 100 and the signal from the detector circuit.

Further, the switching element 23b may be configured such that the earthed switching point is replaced by a floating point coupled to nowhere. In this case, the collector electrode 18 is caused to enter a floating state, by a switching operation in which the point coupled to the fixed connection point is switched from the switching point coupled to the constant voltage source 23c to the switching point in the floating state immediately after the first time point (1). Note that, both the operation in which the second collector voltage V2 is applied to the collector electrode 18 by earthing (grounding) the collector electrode 18 and the operation in which the collector electrode 18 is put under a floating state are each referred to as "turning the collector electrode off" hereinafter.

When the collector electrode 18 is turned off, the collector electrode 18 does not generate an electric field that attracts the emitted electrons or the collector electrode 18 decreases the intensity of such electric field. As a result, unnecessary electron emission (and unnecessary light emission when phosphors opposing the upper electrodes are provided to form a display device) can be avoided.

Subsequently, the collector voltage applying circuit 23 resumes application of the first collector voltage V1 to the collector electrode 18 at another particular time (hereinafter referred to as "collector electrode ON time" for the convenience sake). By this operation, the emitted electrons are accelerated (i.e., given high energy) by the electric field generated by the collector electrode 18 and travel in the upward direction from the upper electrode 14. Thus, the phosphors 19 are irradiated with electrons having high energy, and therefore, high luminance is achieved. In other words, since the collector electrode 18 to which the first collector voltage V1 is applied attracts the emitted electrons, a desired amount of electrons can reach near the collector electrode 18.

In the first embodiment, the collector electrode ON time is set at a predetermined time within the period from "a third time point (3) (i.e., a time t10 in FIG. 8) at which electron accumulation is substantially completed by setting the drive voltage (the voltage between the upper and lower electrodes or the interelectrode voltage) Vin at the predetermined negative value Vm" and to "a second first time point (1) (i.e., the first time point or a time t16 in FIG. 8) that comes after the third time point (3)". In other words, at a predetermined time within the period represented by reference character A in FIG. 8, the connection point to which the fixed connection point of the switching element 23b is connected is switched from the earthed switching point to the switching point coupled to the constant voltage source 23c.

By this arrangement, at least during a period from the time t7 (the second time point (2)) to the time t10 (the third time point (3)), either the collector voltage is maintained at the second predetermined voltage (in this embodiment, 0 V, which is the potential of the ground) since the second collector voltage V2 is applied to the collector electrode 18 or the collector electrode is maintained in the floating state.

As a result, unnecessary electron emission presumably resulting from a large inrush current flowing in the emitter section 13 immediately after the time t7 (the second time point (2)) can be suppressed. Furthermore, it becomes possible to suppress unnecessary electron emission presumably resulting from "a large rate of change in the element voltage after the coercive field" that would occur after a time t9 at which the negative coercive field voltage is exceeded but before the time t10 (the third time point (3)) at which the electron accumulation is completed.

Moreover, since the first collector voltage V1 (the voltage Vc in this embodiment) is applied to the collector electrode, at the latest, before the time t16 (the second first time point (1)) at which the electron emission is completed. Thus, the electrons emitted through the micro through holes 14a of the upper electrode 14 are accelerated by the electric field formed by the collector electrode 18 and travel in the upward direction, thereby being attracted to the collector electrode 18 (the phosphors 19). Thus, the electrons properly emitted can travel toward the collector electrode, and high luminance can be achieved.

Specific Examples of Drive Voltage Applying Circuit, Focusing Electrode Potential Applying Circuit, and Collector Voltage Applying Circuit The specific examples and operation of the drive voltage applying circuit 21, the focusing electrode potential applying circuit 22, and the collector voltage applying circuit 23 will now be explained.

Figure 16:
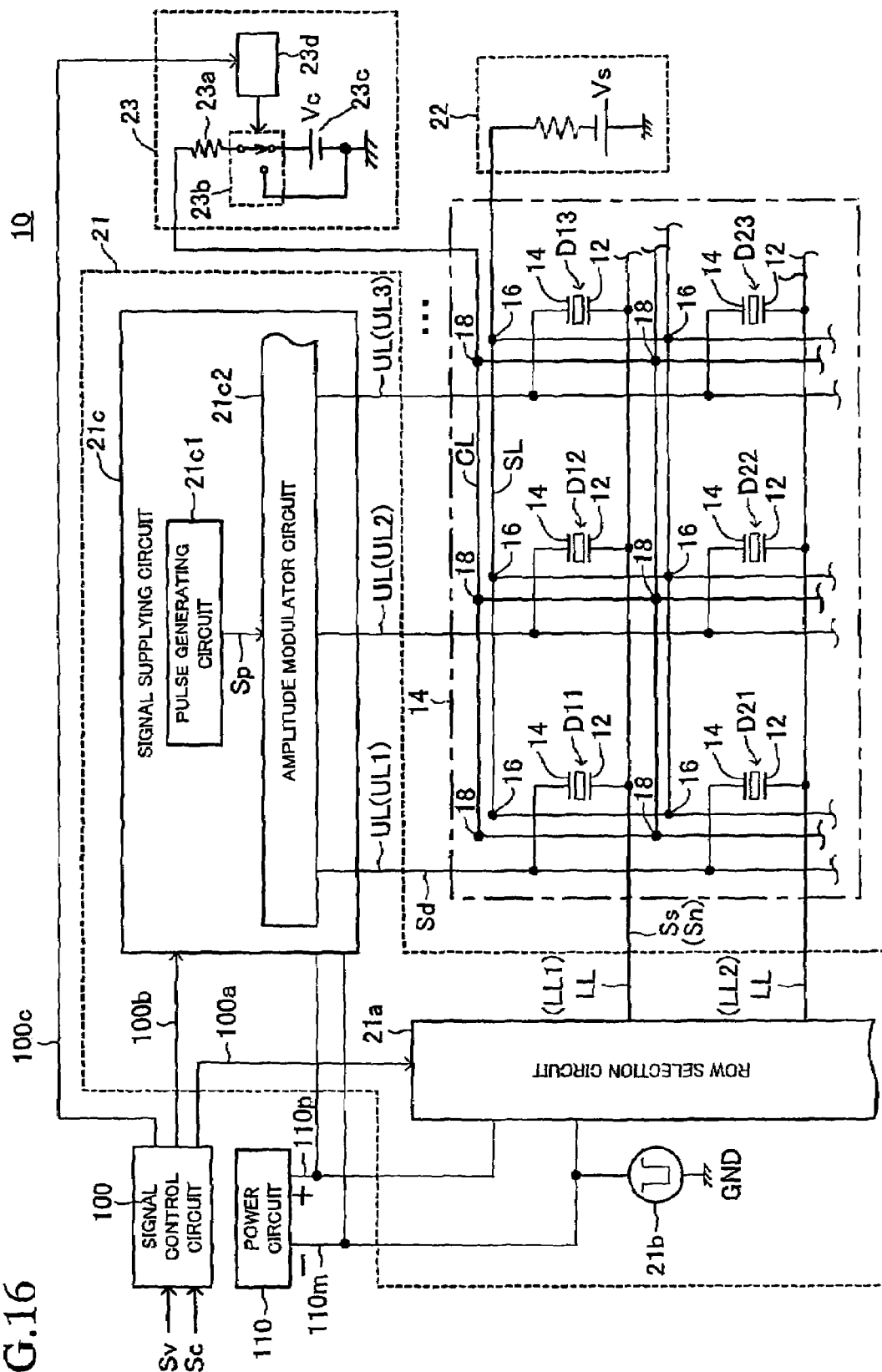
FIG. 16 is a circuit diagram of an electron emission control circuit and a focusing electrode potential applying circuit shown in FIG. 1.

As shown in FIG. 16, the drive voltage applying circuit 21 includes a row selection circuit 21a, a pulse generator 21b, and a signal supplying circuit 21c. In FIG. 16, the components labeled D11, D12, . . . D22, and D23 each represent one element, i.e., an electron-emitting element (one element constituted from the portion where upper electrode 14 is superimposed on the lower electrode 12 with the emitter section 13 therebetween). In this embodiment, the electron emitting apparatus 10 has a number n of elements in the row direction and a number m of elements in the column direction.

The row selection circuit 21a is connected to a control signal line 100a of the signal control circuit 100 and a positive electrode line 110p and a negative electrode line 110m of the power circuit 110. The row selection circuit 21a is also connected to a plurality of row selection lines LL. Each row selection line LL is connected to the lower electrodes 12 of a series of elements in the same row. For example, a row selection line LL1 is connected to the lower electrodes 12 of elements D11, D12, D13, . . . and D1m in the first row, and a row selection line LL2 is connected to the lower electrodes 12 of elements D21, D22, D23, . . . and D2m in the second row.

During the charge accumulation period Td in which electrons are accumulated in the emitter section 13 of each element, the row selection circuit 21a outputs a selection signal Ss (a 50-V voltage signal in this embodiment) to one of the row selection lines LL for a predetermined period (row selection period) Ts and outputs non-selection signals Sn (a 0-V voltage signal in this embodiment) to the rest of the row selection lines LL in response to the control signal from the signal control circuit 100. The row selection line LL to which the selection signal Ss is output from the row selection circuit 21a is sequentially changed every period Ts.

The pulse generator 21b generates a reference voltage (0 V in this embodiment) during a charge accumulation period Td and a predetermined fixed voltage (−400 V in this embodiment) during an emission period (electron emitting period or light ON period) Th. The pulse generator 21b is coupled between the negative electrode line 110m of the power circuit 110 and the ground (GND).

The signal supplying circuit 21c is connected to the a control signal line 100b of the signal control circuit 100 and the positive electrode line 110p and the negative electrode line 110m of the power circuit 110. The signal supplying circuit 21c has a pulse generating circuit 21c1 and an amplitude modulator circuit 21c2 inside.

The pulse generating circuit 21c1 outputs a pulse signal Sp having a predetermined amplitude (50 V in this embodiment) at a predetermined pulse period during the charge accumulation period Td, and outputs a reference voltage (0 V in this embodiment) during the emission period Th.

The amplitude modulator circuit 21c2 is connected to the pulse generating circuit 21c1 so as to receive the pulse signal Sp from the pulse generating circuit 21c1. Further, the amplitude modulator circuit 21c2 is connected to a plurality of pixel signal lines UL. Each pixel signal line UL is connected the upper electrodes 14 of a series of elements in the same column. For example, a pixel signal line UL1 is connected to the upper electrodes 14 of the elements D11, D21, . . . and Dn1 of the first column, a pixel signal line UL2 is connected to the upper electrodes 14 of the elements D12, D22, . . . and Dn2 of the second column, and a pixel signal line UL3 is connected to the upper electrodes 14 of the elements D13, D23, . . . and Dn3 of the third column.

During the charge accumulation period Td, the amplitude modulator circuit 21c2 modulates the amplitude of the pulse signal Sp according to the luminance levels of the pixels in the selected row, and outputs the modulated signal (a voltage signal of 0 V, 30 V, or 50 V in this embodiment), which serves as a pixel signal Sd, to the pixel signal lines UL (UL1, UL2, . . . and ULm). During the emission period Th, the amplitude modulator circuit 21c2 outputs, without any modulation, the reference voltage (0 V) generated by the pulse generating circuit 21c1.

The signal control circuit 100 receives a video signal Sv and a sync signal Sc and outputs a signal for controlling the row selection circuit 21a to the signal line 100a, a signal for controlling the signal supplying circuit 21c to the signal line 100b, and a signal for controlling the collector voltage applying circuit 23 to a signal line 100c based on these received signals.

The power circuit 110 outputs voltage signals to the positive electrode line 110p and the negative electrode line 110m so that the potential of the positive electrode line 110p is higher than the potential of the negative electrode line 110m by a predetermined voltage (50 V in this embodiment).

The focusing electrode potential applying circuit 22 is coupled to a connecting line SL that connects all of the focusing electrodes 16. The focusing electrode potential applying circuit 22 applies to the connecting line SL a potential Vs (e.g., −50 V) with respect to the ground.

The collector voltage applying circuit 23 is connected to an interconnection line CL coupled to the collector electrode 18 and the signal line 100c of the signal control circuit 100. The collector voltage applying circuit 23 alternately applies the positive first voltage Vc and the second voltage (the ground voltage, 0 V, in this embodiment) smaller than the first voltage Vc to the interconnection line CL based on the signal received from the signal control circuit 100.

The operation of the circuit having the above-described structure will now be described. At the beginning of the charge accumulation period Td starting at a particular time, the row selection circuit 21a outputs a selection signal Ss (50 V) to the row selection line LL1 of the first row based on the control signal from the signal control circuit 100 and outputs non-selection signals Sn (0 V) to the rest of the row selection lines LL. As a result, the potential of the lower electrodes 12 of the elements D11, D12, D13, . . . and D1m in the first row becomes the voltage (50 V) of the selection signal Ss. The potential of the lower electrodes 12 of the other elements, for example, the elements D21, D22, . . . and D2m in the second row and the elements D31, D32, . . . and D3m in the third row, becomes the voltage (0 V) of the non-selection signal Sn.

At this time, the signal supplying circuit 21c outputs pixel signals Sd (0 V, 30 V, or 50 V in this embodiment) to the pixel signal lines UL (UL1, UL2, . . . and ULm) based on the control signal from the signal control circuit 100. The pixel signals Sd correspond to the luminance level of the respective pixels constituted from the elements of the selected row, i.e., in this case, the elements D11, D12, D13, . . . and D1$m$ in the first row.

For example, assuming that a 0-V pixel signal Sd is supplied to the pixel signal line UL1, the interelectrode voltage Vin(D11) of the upper electrode 14 of the element D11 with respect to the lower electrode 12 of the same element is the aforementioned negative predetermined voltage Vm, i.e., −50 V (=0 V-50V). A large number of electrons are thus accumulated in the emitter section 13 near the upper electrode 14 of the element D11. Assuming that a 30-V pixel signal Sd is supplied to the pixel signal line UL2, the interelectrode voltage Vin(D12) of the upper electrode 14 of the element D12 with respect to the lower electrode 12 of the same element is the aforementioned negative predetermined voltage Vm, i.e., −20 V (=30 V-50V).

As a result, fewer electrons are stored in the emitter section 13 of the element D12 near the upper electrode 14 than in the element D11. Assuming that a 50-V pixel signal Sd is supplied to the pixel signal line UL3, the interelectrode voltage Vin(D13) of the upper electrode 14 of the element D13 with respect to the lower electrode 12 of the same element is 0 V (=50 V-50 V). Thus, no electron is accumulated in the emitter section 13 of the element D13. That is, no polarization reversal occurs in the emitter section 13 of the element D13.

Once the row selection period Ts (the time period from the time t7 to the time t11 in FIG. 8) is elapsed, the row selection circuit 21$a$ outputs a 50-V selection signal Ss to the row selection line LL2 of the second row based on the control signal from the signal control circuit 100 and outputs 0-V non-selection signals Sn to the rest of the row selection lines LL. By this operation, the potential of the lower electrodes 12 of the elements D21, D22, D23, . . . and D2$m$ in the second row becomes the voltage (50 V) of the selection signal Ss. The potential of the lower electrodes 12 of the rest of the elements (e.g., the elements D11 to D1$m$ in the first row and the elements D31 to D3$m$ in the third row) becomes the voltage (0 V) of the non-selection signals Sn.

At this time, the signal supplying circuit 21$c$ outputs pixel signals Sd (0 V, 30 V, or 50 V in this embodiment) to the pixel signal lines UL (UL1, UL2, . . . and ULm) based on the control signal from the signal control circuit 100. The pixel signals Sd correspond to the luminance level of the respective pixels constituted from the elements of the selected row, i.e., in this case, the elements D21, D22, D23, . . . and D2$m$ in the second row. As a result, electrons are accumulated in the emitter sections of the elements D21, D22, D23, . . . and D2$m$ in the second row, in amounts corresponding to the pixel signals Sd. Note that the interelectrode voltage Vin of the element to which the 0-V non-selection signal Sn is supplied is 50 V at the maximum. However, this level of voltage is not sufficient for emitting electrons from the element in which the electrons have already been accumulated.

Further, when the row selection time Ts is elapsed, the row selection circuit 21$a$ outputs a 50-V selection signal to the row selection line LL3 (not shown) of the third row based on the control signal from the signal control circuit 100 and outputs 0-V non-selection signals Sn to the rest of the row selection lines LL. Meanwhile, the signal supplying circuit 21$c$ outputs pixel signals Sd corresponding to the luminance levels of the respective pixels constituted from the elements in the selected third row to the pixel signal lines UL. Such an operation is repeated every row selection time Ts until all of the rows are selected. As a result, at a predetermined time point, electrons are accumulated in the emitter sections of all the elements in amounts (including zero) corresponding to the luminance levels of the respective elements. This summarizes the operation that takes place during the charge accumulation period Td.

In order to start the emission period Th, the row selection circuit 21$a$ applies a large negative voltage to all of the row selection lines LL. In this embodiment, the applied voltage is −350 V, i.e., the difference between +50 V generated by the power circuit 110 and −400 V generated by the pulse generator 21$b$. Consequently, the potential of the lower electrodes 12 of all the elements becomes a large negative voltage (−350 V). Meanwhile, the signal supplying circuit 21$c$ outputs the reference voltage (0 V), which is generated by the pulse generating circuit 21$c$1, through the amplitude modulator circuit 21$c$2 without modulation to all of the pixel signal lines UL. As a result, the potential of the upper electrodes 14 of all the elements becomes the reference voltage (0 V).

Thus, since the interelectrode voltage Vin between the upper electrode 14 and the corresponding lower electrode 12 becomes a large positive predetermined voltage (350 V) in all of the elements, the electrons accumulated in the emitter section 13 of the respective elements are emitted all at once due to Coulomb repulsion. This causes the phosphors disposed above the elements to emit light and to thereby display images. Note that in the emitter section of the elements, to which a zero interelectrode voltage Vin is applied during the charge accumulation period Td when selected and therefore, which does not have accumulated electrons, no negative polarization reversal has occurred. Thus, no positive polarization reversal occurs even when the interelectrode voltage Vin is turned to a large positive voltage. Accordingly, for example, the element that is not required to emit light for the purpose of producing a particular image at a particular timing does not consume excess energy that accompanies the polarization reversal.

As is described above, during the charge accumulation period Td, the drive voltage applying circuit 21 consecutively (sequentially) sets the interelectrode voltage Vin of the plurality of elements at the negative predetermined voltage Vm one after next. Upon completion of electron accumulation in all the elements, the drive voltage applying circuit 21 simultaneously sets the interelectrode voltage Vin of all the elements at the positive predetermined voltage Vp so as to cause simultaneous electron emission from all of the elements and to initiate the emission period Th. After the predetermined emission period Th has elapsed, the drive voltage applying circuit 21 again starts the charge accumulation period Td.

Moreover, as is previously stated, since a predetermined voltage (Vs) is applied to each focusing electrode 16, the electrons released from the upper electrode 14 only reach the phosphor directly above the upper electrode 14. Thus, a sharp image can be produced.

Meanwhile, the collector voltage applying circuit 23 turns off the collector electrode 18 at a particular time within the period starting from the first time point (1), i.e., the time t6, and ending at the second time point (2), i.e., the time t7. Here, the first time point (1) is the time at which electron emission from all of the elements is first completed, and the second time point (2) is the time at which the interelectrode voltage Vin of the element in which the electrons should and will be accumulated earliest among the plurality of elements becomes the negative predetermined voltage Vm. By this operation, the collector electrode 18 is caused to be turned off before the charge accumulation period Td for all the elements is started.

The collector voltage applying circuit 23 turns on the collector electrode 18 at a particular time within the period starting from "a third time point (3) at which the electron accumulation is completed in the element whose interelectrode voltage Vin becomes the negative predetermined voltage Vm latest during a charge accumulation period Td" and ending at "a second first time point (1) that comes after the third time point (3)". In other words, at a particular point in the period represented by reference character A in FIG. 8, the connecting point to which the fixed connection point of the switching element 23b is coupled is switched from the earthed switching point to the switching point connected to the constant voltage source 23c. Thus, the electrons simultaneously emitted from the elements enter the phosphors 19 while retaining high energy to excite the phosphors 19.

As is stated above, in this electron emitting apparatus 10, there is no element which is accumulating electrons while other elements are emitting electrons. Thus, the electron emitting apparatus 10 having the plurality of elements can suppress unnecessary electron emission and impart energy to electrons properly emitted, merely by switching between the ON status and the OFF status of the collector electrode 18 using the collector voltage applying circuit 23. Consequently, the collector voltage applying circuit 23 becomes less expensive and simpler.

Second Embodiment

An electron-emitting apparatus according to a second embodiment of the present invention will now be described. The second embodiment differs from the first embodiment only in that the collector electrode ON time is set at a time point different from the collector electrode ON time of the first embodiment. Thus, the description below is mainly directed to this difference.

In the second embodiment, the collector electrode ON time is set at a fourth time point (4) (the time t11 represented by reference character B in FIG. 8) at which the interelectrode voltage (drive voltage) Vin is again set, after the electrons are emitted, at the positive predetermined voltage Vp. In detail, based on the signal fed from the signal control circuit 100, the collector voltage applying circuit 23 switches the switching point to which the fixed connection point of the switching element 23b is connected from the earthed switching point to the switching point connected to the constant voltage source 23c.

By this operation, the second collector voltage V2 is applied to the collector electrode 18 to thereby set the collector voltage at the second collector voltage (the ground potential, 0 V, in this embodiment) or the collector electrode 18 is maintained in the floating state, at least during the period from the time t7 (the second time point (2)) to the time t11 (the fourth time point (4)). Here, the time t7 is the time at which the interelectrode voltage Vin is set at the negative predetermined voltage Vm to start electron accumulation, and the lime t11 is the time at which the interelectrode voltage Vin is again changed to the positive predetermined voltage Vp.

Thus, as in the first embodiment, unnecessary electron emission presumably resulting from a large inrush current flowing in the emitter section immediately after the time t7 (the second time point (2)) can be suppressed. Furthermore, it becomes possible to suppress unnecessary electron emission presumably resulting from "a large rate of change in element voltage Vka after coercive electric field" that occurs during a period from the time t9 from which the voltage exceeds the negative-side coercive field voltage (the time t9 being a time at which the negative-side polarization reversal is completed) to the time t10 (the third time point (3)) at which the electron accumulation is completed.

Furthermore, since the first collector voltage V1 (voltage Vc in this embodiment) is applied to the collector electrode 18 over the entire electron emission period (the period from the time t11 to immediately before the time t16), the electrons properly emitted can be led near the collector electrode 18.

Third Embodiment

An electron-emitting apparatus according to a third embodiment of the present invention will now be described. The third embodiment differs from the first embodiment only in that the collector electrode ON time is set to a time point different from the collector electrode ON time of the first embodiment. Thus, the description below is mainly directed to this difference.

In the third embodiment, the collector electrode ON time is set at a particular time within the period "starting from immediately after a fifth time point (5) (i.e., a time t12 in FIG. 8) at which the inrush current in the emitter section 13 becomes the maximum by again changing the interelectrode voltage (drive voltage) Vin to the positive predetermined voltage Vp" after the electron emission and "ending at a sixth time point (6) (i.e., a time t14) at which the polarization reversal (the positive-side polarization reversal) in the emitter section is substantially completed".

Specifically, the switch control circuit 23d of the collector voltage applying circuit 23 includes an element current measuring circuit for measuring current flowing between the lower electrode 12 and the upper electrode 14 and a current peak detector circuit for detecting the peak of the measured current. Based on the signal fed from the signal control circuit 100 and the signal fed from the current peak detector circuit, the collector voltage applying circuit 23 detects the fifth time point (5) and switches the switching point to which the fixed connection point of the switching element 23b is coupled from the earthed switching point to the switching point coupled to the constant voltage source 23c immediately after the fifth time point (5). Note that since it requires some time from the start of the positive-side polarization reversal in the emitter section 13 to the end of the polarization reversal, turning off the collector electrode 1a immediately after the detection of the fifth time point (5) enables the collector electrode 18 to turn off by a time immediately before the sixth time point (6).

By this operation, at least during the period starting from the time t7 (the second time point (2)) and ending at immediately after the time t12 (the fifth time point (5)), either the second collector voltage V2 continues to be applied to the collector electrode 18 or the collector electrode 18 is maintained in the floating state. Here, the time t7 is a time at which the interelectrode voltage Vin is set at the negative predetermined voltage Vm to start electron accumulation, and the time t12 is a time at which the inrush current flowing in the emitter section 13 becomes maximum by setting the interelectrode voltage Vin again at the positive predetermined voltage Vp.

As a result, unnecessary electron emission that would occur during the period from the time t7 to the time t10 (see FIG. 8) during the electron accumulation can be suppressed. It also becomes possible to suppress unnecessary electron emission presumably resulting from large inrush current that flows in the emitter section immediately after the time point at which the interelectrode voltage Vin is again changed to the positive predetermined voltage Vp to initiate electron emission at the time t11 (the fourth time point (4)).

At the latest, after the time t14 (the sixth time point (6)) at which the polarization reversal (positive-side polarization reversal) in the emitter section is substantially completed, the first collector voltage V1 is applied to the collector electrode 18. Thus, electrons properly emitted during the period from the time t14 (the sixth time point (6)) to the time t16 (the first time point (1)) can be led to near the collector electrode 18.

Fourth Embodiment

An electron-emitting apparatus according to a fourth embodiment of the present invention will now be described. The fourth embodiment differs from the first embodiment only in that the collector electrode ON time is set at a time point different from the collector electrode ON time of the first embodiment. Thus, the description below is mainly directed to this difference.

In the fourth embodiment, the collector electrode ON time is set at a particular time within the period starting from "the sixth time point (6) (i.e., a time t14 in FIG. 8) at which the polarization reversal (the positive-side polarization reversal) in the emitter section 13 is substantially completed by changing the interelectrode voltage (drive voltage) Vin again to the positive predetermined voltage Vp" after the electron emission and ending at "a time point immediately before a second first time point (1) (i.e., a time t16 in FIG. 8) which comes after the sixth time point (6)". This period is represented by reference character D in FIG. 8.

To be more specific, the switch control circuit 23d of the collector voltage applying circuit 23 includes an element voltage measuring circuit and a detector circuit for detecting the completion of the positive-side polarization reversal. The element voltage measuring circuit measures the element voltage Vka. The detector circuit monitors the waveform of the element voltage Vka measured by the element voltage measuring circuit and detects, as the sixth time point (6) at which the polarization reversal in the emitter section 13 is substantially completed, a time point at which the rate of change in element voltage Vka over time (i.e., dVka/dt) starts to increase rapidly (i.e., dVka/dt exceeds the predetermined value) after the rate of change in element voltage Vka over time (i.e., dVka/dt) becomes smaller than a predetermined value when the element voltage Vka becomes around the positive coercive field voltage.

Based on the signal from the signal control circuit 100 and the signal from the detector circuit, the collector voltage applying circuit 23 detects the sixth time point (6) and switches the connecting point to which the fixed connection point of the switching element 23b is coupled from the earthed switching point to the switching point connected to the constant voltage source 23c immediately after the detection of the sixth time point (6).

By this operation, at least during the period starting from "the time t7 (the second time point (2)) at which the interelectrode voltage Vin is set at the negative predetermined voltage Vm to start electron accumulation" and and ending at "the time t14 (the sixth time point (6)) at which the polarization reversal in the emitter section 13 is substantially completed by changing the interelectrode voltage Vin again to the positive predetermined voltage Vp", either the collector voltage is kept at the second predetermined voltage (the ground potential, 0 V, in this embodiment) because the second collector voltage V2 is applied to the collector electrode 18 or the collector electrode is maintained in the floating state.

As a result, unnecessary electron emission that would occur during the period in which the electrons are accumulated from the time t7 to the time t10 can be suppressed. It also becomes possible to suppress unnecessary electron emission presumably resulting from large inrush current that flows in the emitter section immediately after the time point at which the interelectrode voltage Vin is again changed to the positive predetermined voltage Vp to initiate electron emission at the time t11 (the fourth time point (4)). Furthermore, it becomes possible to suppress unnecessary electron emission that would occur when initiating the electron emission during the period from the time t11 to the time t14.

On the other hand, the first collector voltage V1 can be applied to the collector electrode 18 before the time t16 (the first time point (1)) at the latest, the time t16 being the time when the electron emission is completed. Thus, the electrons emitted properly can be led to the collector electrode 18.

Fifth Embodiment

An electron-emitting apparatus according to a fifth embodiment of the present invention will now be described. The fifth embodiment differs from the first embodiment only in that the collector electrode ON time is set at a time point different from the collector electrode ON time of the first embodiment. Thus, the description below is mainly directed to this difference.

In the fifth embodiment, the collector electrode ON time is set at a particular time point within the period "starting from the sixth time point (6) (i.e., the time t14 in FIG. 8) at which the polarization reversal in the emitter section 13 is substantially completed by changing the interelectrode voltage (drive voltage) Vin again to the positive predetermined voltage Vp" after the electron emission and "ending at a seventh time point (7) (i.e., a time t15 in FIG. 8) at which the amount of the electrons that are emitted from the emitter section 13 (through the micro through holes 14a of the upper electrodes 14) and reach the collector electrode 18 becomes the maximum per unit time". The period is represented by reference character E in FIG. 8.

More specifically, the switch control circuit 23d of the collector voltage applying circuit 23 includes an element voltage measuring circuit, a first detector circuit for detecting completion of the positive-side polarization reversal, a collector current measuring circuit, and a second detector circuit for detecting the value near the collector current peak.

The element voltage measuring circuit measures the element voltage Vka. The first detector circuit monitors the waveform of the element voltage Vka measured by the element voltage measuring circuit and detects, as the sixth time point (6) at which the polarization reversal in the emitter section 13 is substantially completed, a time point at which the rate of change in element voltage Vka over time (i.e., dVka/dt) starts to increase rapidly after the rate of change in element voltage Vka over time (i.e., dVka/dt) becomes smaller than a predetermined value when the element voltage Vka reaches the voltage around the positive coercive field voltage Vd.

The collector current measuring circuit measures the current (collector current) flowing in the collector electrode 18. The second detector circuit monitors the waveform of the collector current measured by the collector current measuring circuit and detects a time point at which the collector current becomes near the expected maximum value (peak).

Based on the signals from the signals control circuit 100, the first detector circuit for detecting the completion of the positive-side polarization reversal, and the second detector circuit for detecting the value near the collector current peak, the collector voltage applying circuit 23 switches the switching point to which the fixed connection point of the switching element 23b is coupled from the earthed switching point to the switching point connected to the constant voltage source 23c at a particular time after the sixth time point (6) but before the seventh time point (7), i.e., at the time when the value near the peak of the collector current is detected by the second detector circuit.

According to this arrangement, at least during the period starting from "the time t7 (the second time point (2)) at which the interelectrode voltage Vin is set at the negative predetermined voltage Vm to start electron accumulation" and and ending at "the time t14 (the sixth time point (6)) at which the polarization reversal in the emitter section 13 is substantially completed by changing the interelectrode voltage Vin again to the positive predetermined voltage Vp", either the collector voltage is at the second predetermined voltage (the ground potential, 0 V, in this embodiment) because the second collector voltage V2 is applied to the collector electrode 18 or the collector electrode is maintained in the floating state.

As a result, unnecessary electron emission that would occur during the period in which the electrons are accumulated from the time t7 to the time t10 can be suppressed. It also becomes possible to suppress unnecessary electron emission presumably resulting from large inrush current that flows in the emitter section 13 immediately after the time point at which the interelectrode voltage Vin is again changed to the positive predetermined voltage Vp to initiate electron emission at the time t11 (the fourth time point (4)). Furthermore, it becomes possible to suppress unnecessary electron emission that would occur when initiating the electron emission during the period from the time t11 to the time t14.

Meanwhile, at the latest, after the time t15 (the seventh time point (7)) at which the amount of the electrons (collector current) emitted from the emitter section 13 and reaching the collector electrode 18 becomes the largest per unit time, the first collector voltage V1 is applied to the collector electrode 18. As a result, only the electrons properly emitted can be more securely led to near the collector electrode 18.

Sixth Embodiment

An electron-emitting apparatus according to a sixth embodiment of the present invention will now be described. The sixth embodiment differs from the first embodiment only in that the collector electrode ON time is set at a time point different from the collector electrode ON time of the first embodiment. Thus, the description below is mainly directed to this difference.

In the sixth embodiment, the collector electrode ON time is set at "a time point (represented by reference character F in FIG. 8) at which the actual potential difference (i.e., the element voltage) Vka between the lower electrode 12 and the upper electrode 14 reaches the predetermined threshold voltage Vth after the interelectrode voltage (drive voltage) Vin is changed to the positive predetermined voltage Vp for the second time" after the electron emission. Here, the predetermined threshold voltage Vth is set such that the collector electrode ON time comes between the sixth time point (6) and the seventh time point (7). In other words, the predetermined threshold voltage Vth is preferably set at a voltage slightly larger than the positive coercive field voltage Vd but slightly smaller than the positive predetermined voltage Vp.

Specifically, the switch control circuit 23d of the collector voltage applying circuit 23 includes an element voltage measuring circuit and a comparator circuit. The element voltage measuring circuit measures the element voltage Vka. The comparator circuit compares the element voltage Vka measured by the element voltage measuring circuit with the predetermined threshold voltage Vth, and outputs the result of the comparison.

Based on the signals from the signal control circuit 100 and the comparator circuit, the collector voltage applying circuit 23 switches the connecting point to which the fixed connection point of the switching element 23b is coupled from the earthed switching point to the switching point connected to the constant voltage source 23c at a time when the element voltage Vka reaches the predetermined threshold voltage Vth.

This embodiment is particularly advantageous when the electron-emitting apparatus is applied to a display including a plurality of elements each of which forms one of a plurality of pixels. In this type of display, the amount of the electrons to be emitted changes according to the images to be displayed. Thus, even in case the same positive predetermined voltage Vp is applied between the lower electrode 12 and the upper electrode 14, the changes in element voltage Vka varies with the images.

Therefore, as in this embodiment, by turning on the collector electrode at the time point when the actual element voltage Vka reaches the predetermined threshold voltage Vth, the voltage applied to the collector electrode 18 and/or the state of the collector electrode 18 can be adequately switched at an optimum timing despite the change in element voltage Vka. Here, the optimum timing is one that can suppress unnecessary electron emission while leading as many properly emitted electrons as possible toward the collector electrode.

Seventh Embodiment

Figure 17:
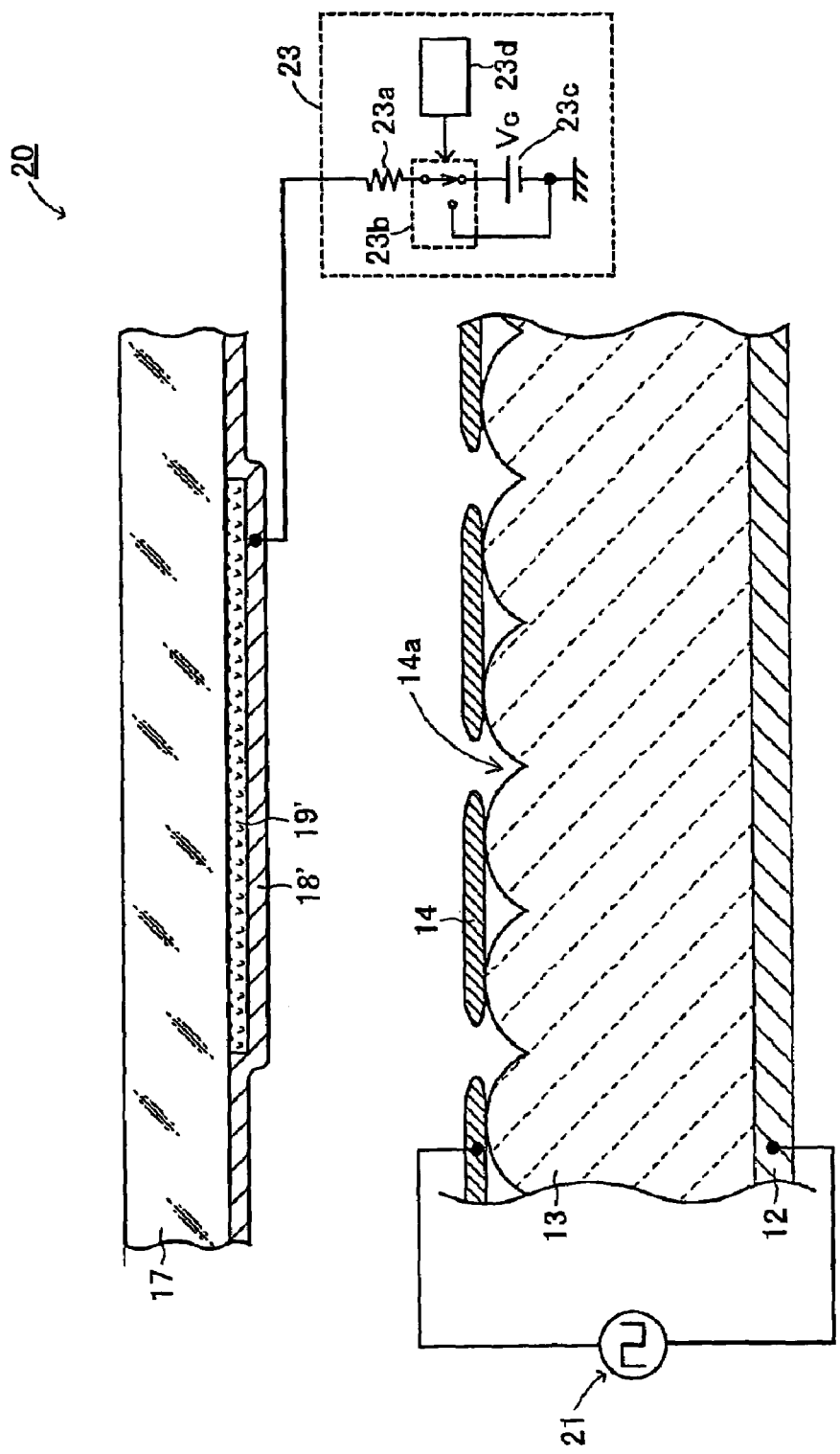
FIG. 17 is a partial cross-sectional view of an electron-emitting apparatus according to a seventh embodiment of the present invention.

An electron-emitting apparatus 20 according to a seventh embodiment of the present invention will now be described with reference to FIG. 17. The electron-emitting apparatus 20 differs from the electron emitting apparatus 10 only in that the collector electrode 18 and the phosphors 19 of the electron emitting apparatus 10 are replaced by a collector 18' and phosphors 19', respectively. Thus, the description below is mainly directed to this difference.

In the electron-emitting apparatus 20, a phosphor 19' is disposed on the back surface of the transparent plate 17 (i.e., on the surface facing the upper electrode 14), and a collector electrode 18' is disposed to cover the phosphor 19'. The collector electrode 18' has a thickness that allows electrons emitted from the emitter section 13 through the micro through holes 14a in the upper electrode 14 to travel through the collector electrode 18'. The thickness of the collector electrode 18' is preferably 100 nm or less. The thickness of the collector electrode 18' can be larger as the kinetic energy of the emitted electrons is higher.

The configuration of this embodiment is typically employed in cathode ray tubes (CRTs). The collector electrode 18' functions as a metal back. The electrons emitted from the emitter section 13 through the micro through holes 14a in the upper electrode 14 travel through the collector electrode 18', enter the phosphor 19', and excite the phosphor 19', thereby causing light emission. The advantages of the electron-emitting apparatus 20 are as follows:

(a) When the phosphor 19' is not electrically conductive, electrification (negative charging) of the phosphor 19' can be avoided. Thus, the electric field that accelerates electrons can be maintained.

(b) Since the collector electrode 18' reflects light generated by the phosphor 19', the light can be emitted toward the transparent plate 17-side (the emission surface side) with higher efficiency.

(c) Since collision of excessive electrons against the phosphor 19' can be avoided, deterioration of the phosphor 19' and the generation of gas from the phosphor 19' can be avoided.

Materials of Constituent Components and Production Examples

The materials of the constituent components of the electron-emitting apparatuses described above and the method for producing the constituent components will now be described.

Lower Electrode 12

The lower electrode is made of an electrically conductive material described above. Examples of the conductive materials include metal conductors such as platinum, molybdenum, tungsten, gold, silver, copper, aluminum, nickel, and chromium. Examples of the preferable materials for the lower electrode will be described in detail below:

(1) Conductors resistant to high-temperature oxidizing atmosphere (e.g., elemental metals or alloys)

Examples: high-melting-point noble metals such as platinum, iridium, palladium, rhodium, and molybdenum Examples: materials mainly made of a silver-palladium alloy, a silver-platinum alloy, or a platinum-palladium alloy (2) Mixtures of ceramics having electrical isolation and being resistant to high-temperature oxidizing atmosphere and elemental metals Example: a cermet material of platinum and a ceramic (3) Mixtures of ceramics having electrical isolation and being resistant to high-temperature oxidizing atmosphere and alloys (4) Carbon-based or graphite-based materials Among these materials above, elemental platinum and materials mainly composed of platinum alloys are particularly preferable. It should be noted that when a ceramic material is added to the electrode material, it is preferable to use roughly 5 to 30 percent by volume of the ceramic material. Materials similar to those of the upper electrode 14 described below may also be used for the lower electrode. The lower electrode is preferably formed by a thick-film forming process. The thickness of the lower electrode is preferably 20 μm or less and most preferably 5 μm or less.

Emitter Section 13

The dielectric material that constitutes the emitter section may be a dielectric material having a relatively high relative dielectric constant (for example, a relative dielectric constant of 1,000 or higher). Examples of the preferable material for the emitter section are as follows:

(1) Barium titanate, lead zirconate, lead magnesium niobate, lead nickel niobate, lead zinc niobate, lead manganese niobate, lead magnesium tantalate, lead nickel tantalate, lead antimony stannate, lead titanate, lead magnesium tungstate, and lead cobalt niobate (2) Ceramics containing any combination of the substances listed in (1) above (3) Ceramics described in (2) further containing an oxide of lanthanum, calcium, strontium, molybdenum, tungsten, barium, niobium, zinc, nickel, or manganese; ceramics described in (2) further containing any combination of the oxides described above; and ceramics described in (2) further containing other compounds (4) Materials mainly containing 50% or more of the materials listed in (1) above It is noted that, for example, a two-component system containing lead magnesium niobate (PMN) and lead titanate (PT), i.e., nPMN-mPT (n and m represent molar ratios), can exhibit a decreased Curie point and a large relative dielectric constant at room temperature by increasing the molar ratio of the PMN. In particular, nPMN-mPT having n of 0.85 to 1.0 and m of 1.0-n exhibits a relative dielectric constant of 3,000 or higher and is thus particularly preferable as the material for the emitter section. For example, the nPMN-mPT having n of 0.91 and m of 0.09 exhibits a relative dielectric constant of 15,000 at room temperature. The nPMN-mPT having n of 0.95 and m of 0.05 exhibits a relative dielectric constant of 20,000 at room temperature.

Furthermore, a three-component system containing lead magnesium niobate (PMN), lead titanate (PT), and lead zirconate (PZ), i.e., PMN-PT-PZ, can exhibit a higher relative dielectric constant by increasing the molar ratio of PMN. In this three-component system, the relative dielectric constant can be increased by adjusting the composition to near the morphotropic phase boundary (MPB) between the tetragonal and pseudocubic phases or between the tetragonal and rhombohedral phases.

For example, PMN:PT:PZ of 0.375:0.375:0.25 yields a relative dielectric constant of 5,500, and PMN:PT:PZ of 0.5:0.375:0.125 yields a relative dielectric constant of 4,500. These compositions are particularly preferable as the material for the emitter section.

Furthermore, a metal, such as platinum, may be preferably added to the dielectric material as long as the insulating ability can be ensured in order to increase the dielectric constant. For example, 20 percent by weight of platinum may preferably be added to the dielectric material.

A piezoelectric/electrostrictive layer, a ferroelectric layer or an antiferroelectric layer may be used as the emitter section. When the emitter section is a piezoelectric/electrostrictive layer, the piezoelectric/electrostrictive layer may be composed of a ceramic containing lead zirconate, lead magnesium niobate, lead nickel niobate, lead zinc niobate, lead manganese niobate, lead magnesium tantalate, lead nickel tantalate, lead antimony stannate, lead titanate, barium titanate, lead magnesium tungstate, lead cobalt niobate, or any combination of these.

Obviously, the emitter section may be made of a material containing 50 percent by weight or more of the above-described compound as the main component. Among the ceramics described above, a ceramic containing lead zirconate is most frequently used as the constituent material for the piezoelectric/electrostrictive layer that serves as the emitter section.

When the piezoelectric/electrostrictive layer is formed using a ceramic, the ceramic may further contain an oxide of lanthanum, calcium, strontium, molybdenum, tungsten, barium, niobium, zinc, nickel, or manganese, or any combination of these oxides, or other compounds. The ceramic described above may further contain $SiO_2$, $CeO_2$, $Pb_5Ge_3O_{11}$, or any combination of these. In particular, a PT-PZ-PMN-based piezoelectric material containing 0.2 percent by weight of $SiO_2$, 0.1 percent by weight of $CeO_2$, or 1 to 2 percent by weight of $Pb_5Ge_3O_{11}$ is preferable.

In detail, for example, a ceramic mainly composed of lead magnesium niobate, lead zirconate, and lead titanate, and containing lanthanum or strontium in addition to these is particularly preferable.

The piezoelectric/electrostrictive layer may be dense or porous. When the piezoelectric/electrostrictive layer is porous, the void ratio is preferably 40% or less.

When an antiferroelectric layer is used as the emitter section 13, the antiferroelectric layer preferably contains lead zirconate as a main component, lead zirconate and lead stannate as main components, lead zirconate containing lanthanum oxide as an additive, or a lead zirconate and lead stannate containing lead niobate as an additive.

The antiferroelectric layer may be porous. When the antiferroelectric layer is porous, the void ratio thereof is preferably 30% or less.

In particular, strontium tantalate bismuthate ($SrBi_2Ta_2O_9$) is suitable for the emitter section, since it exhibits low fatigue by repeated polarization reversal. The material exhibiting low fatigue is a laminar ferroelectric compound represented by general formula $(BiO_2)^{2+}(A_{m-1}B_mO_{3m+1})^{2-}$. In the formula, the ions of the metal A are $Ca^{2+}$, $Sr^{2+}$, $Ba^{2+}$, $Pb^{2+}$, $Bi^{3+}$, $La^{3+}$, or the like, and the ions of the metal B are $Ti^{4+}$, $Ta^{5+}$, $Nb^{5+}$, or the like. Alternatively, a piezoelectric ceramic based on barium titanate, lead zirconate, or PZT may be combined with an additive to impart semiconductive properties to the ceramic. In such a case, since the emitter section 13 provide an uneven electric field distribution, it becomes possible to concentrate the electric field near the boundary with the upper electrode that contributes to release electrons.

The firing (baking) temperature of the emitter section 13 can be decreased by adding a glass component, such as lead borosilicate glass, or a low-melting-point compound (such as bismuth oxide) other than the glass component to the piezoelectric/electrostrictive/ferroelectric/antiferroelectric ceramic.

In forming the emitter section with the piezoelectric/electrostrictive/ferroelectric/antiferroelectric ceramic, the emitter section may be formed from a molded sheet, a laminated sheet, or a composite of the molded sheet or the laminated sheet stacked or bonded on a supporting substrate.

An emitter section that is hardly damaged by collision of electrons or ions can be produced by using a material having a high melting point or a high evaporation temperature, e.g., a non-lead material, for the emitter section.

The emitter section may be formed by various thick-film forming processes, such as a screen printing process, a dipping process, an application process, an electrophoresis process, and an aerosol deposition process; or by various thin-film forming processes, such as an ion-beam process, a sputtering process, a vacuum deposition process, an ion-plating process, a chemical vapor deposition (CVD) process, and a plating process. In particular, a powdered piezoelectric/electrostrictive material may be molded to form the emitter section, and the molded emitter section may be impregnated with a low-melting-point glass or sol particles to form a film at a temperature as low as 700° C. or 600° C. or less.

Upper Electrode 14

An organometal paste that can produce a thin film by firing (baking) is used to form the upper electrode. An example of the organometal paste is a platinum resinate paste. The upper electrode is preferably made of an oxide that can decrease the fatigue due to polarization reversal or a platinum resinate paste containing an oxide for decreasing the fatigue by polarization reversal. Examples of the oxide that decreases the fatigue due to polarization reversal include ruthenium oxide ($RuO_2$), iridium oxide ($IrO_2$), strontium ruthenate ($SrRuO_3$), $La_{1-x}Sr_xCoO_3$ (e.g., x=0.3 or 0.5), $La_{1-x}Ca_xMnO_3$ (e.g., x=0.2), and $La_{1-x}Ca_xMn_{1-y}Co_yO_3$ (e.g., x=0.2, y=0.05).

It is also preferable to use an aggregate of scale-like substances, such as graphite, or an aggregate of conductive substances containing scale-like substances to form the upper electrode. Since such an aggregate has gaps between scales, the gaps can serve as the micro through holes in the upper electrode, and thus no baking process is needed to form the upper electrode. Alternatively, an organic resin and a metal thin film may be sequentially stacked on the emitter section and baked to burn off the organic resin and to thereby form micro through holes in the metal thin film, which serves as the upper electrode.

The upper electrode may be formed by various thick-film forming processes, such as a screen printing process, a spraying process, a coating process, a dipping process, an application process, and an electrophoresis process; or by various typical thin-film forming processes, such as a sputtering process, an ion-beam process, a vacuum deposition process, an ion-plating process, a chemical vapor deposition (CVD) process, and a plating process.

As is described above, each of the electron-emitting apparatuses of the embodiments and modification examples of the present invention turns off the collector electrode when there is a possibility of occurrence of unnecessary electron emission and turns on the collector electrode when electron emission is necessary. Thus, each of the electron-emitting apparatus can impart sufficient energy to electrons properly emitted while avoiding unnecessary electron emission, and therefore, provide a display that can present satisfactory images. Moreover, even when the space between the upper electrode 14 and the collector electrode 18 enters a plasma state, the plasma can be eliminated since the collector electrode 18 is intermittently turned off. As a result, continuous generation of intense emission due to a continuing plasma state can be avoided.

In addition, the apparatus includes the focusing electrode. Thus, the distance between the upper electrode and the collector electrode can be Increased since emitted electrons substantially travel in the upward direction of the upper electrode. As a result, dielectric breakdown between the upper electrode and the collector electrode can be suppressed or prevented. Because the possibility of dielectric breakdown between the upper electrode and the collector electrode reduces, the first collector voltage V1 (Vc) applied to the collector electrode 18 during the period in which the collector electrode 18 is turned on can be increased. Thus, large energy can be imparted to the electrons reaching the phosphors, and the luminance of the display can be thereby increased.

Figure 18:
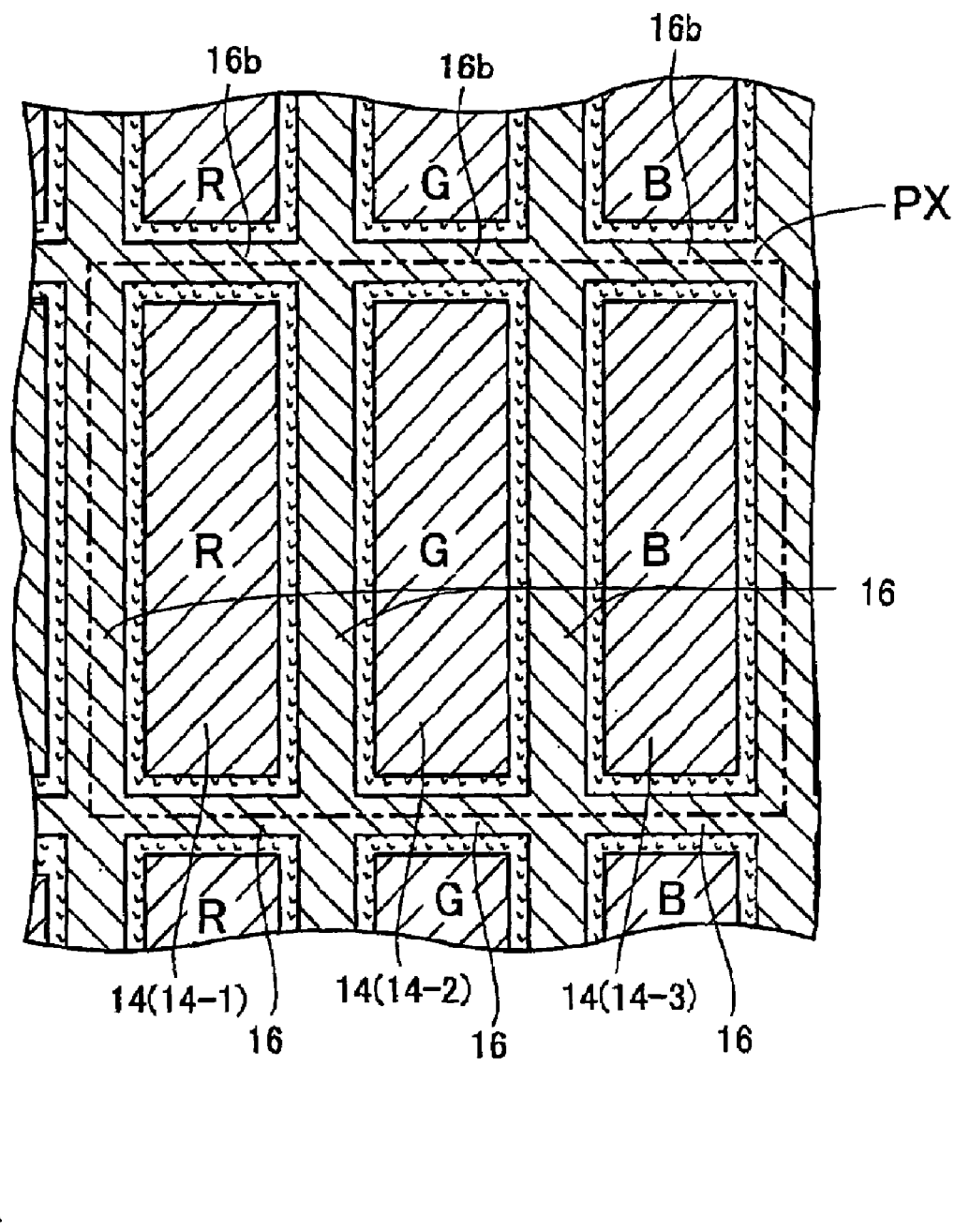
FIG. 18 is a partial plan view of a modification example of the electron-emitting apparatus shown in FIG. 1 or 17.

Note that the present invention is not limited to the embodiments described above and various other modifications and alternations are possible without departing from the scope of the invention. For example, as shown in FIG. 18, the focusing electrodes 16 may be formed not only between the upper electrodes 14 adjacent to each other in the X-axis direction but also between the upper electrodes 14 adjacent to each other in the Y-axis direction in a plan view.

According to this arrangement, electrons emitted from the upper electrode 14 of a particular element do not reach the phosphor disposed above the other upper electrode 14 of an adjacent element. Thus, color purity can be satisfactorily maintained. In this embodiment, the focusing electrodes 16 are also disposed between the upper electrodes 14 of the elements adjacent to each other in the Y-axis direction. Thus, electrons emitted from the upper electrode 14 of a particular upper electrode 14 do not reach the phosphor disposed above the adjacent upper electrode 14. Thus, blurring of image patterns can be prevented.

Figure 19:
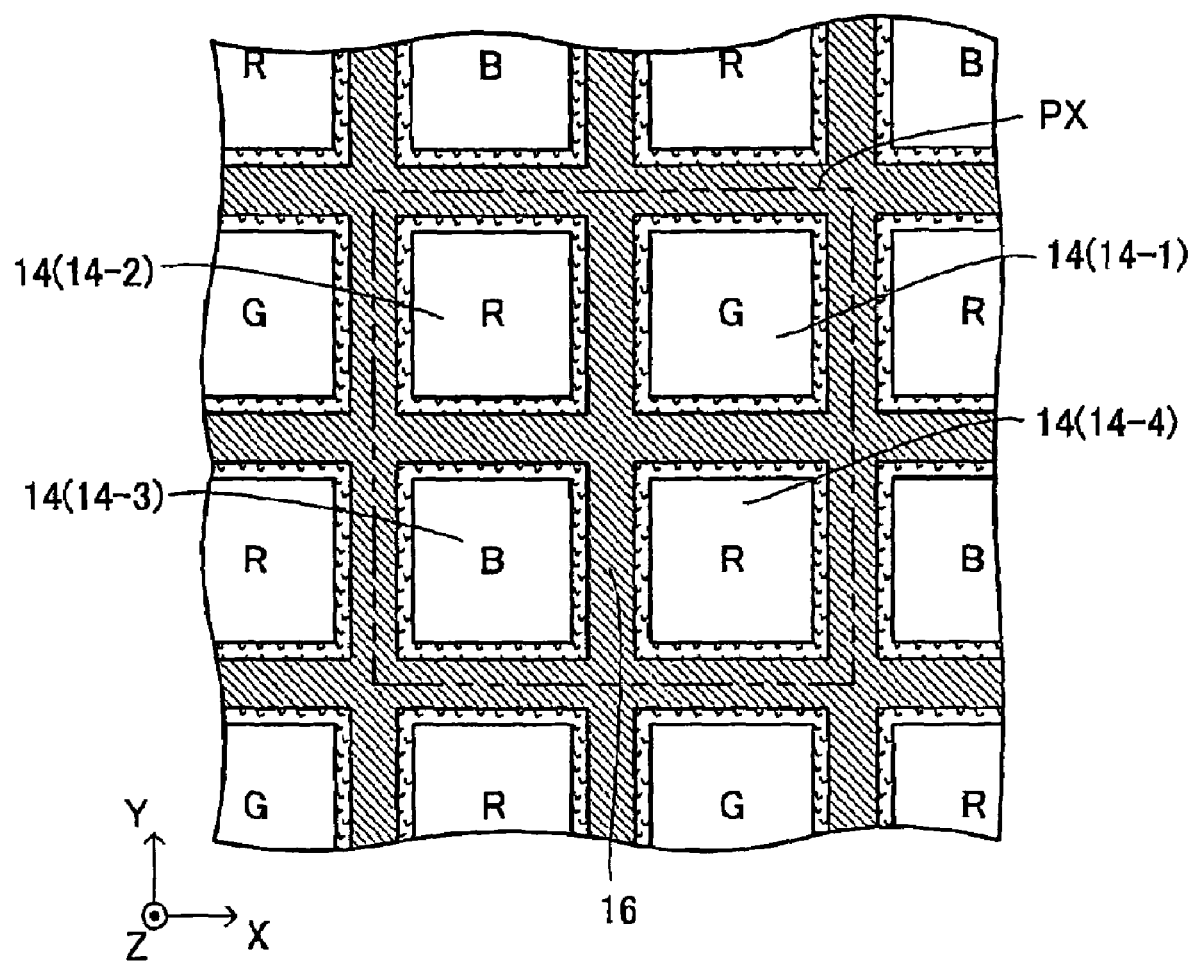
FIG. 19 is a partial plan view of another modification example of the electron-emitting apparatus shown in FIG. 1 or 17.

Furthermore, as shown in FIG. 19, one pixel PX of the electron-emitting apparatus may include four elements (a first upper electrode 14-1, a second upper electrode 14-2, a third upper electrode 14-3, and a fourth upper electrode 14-4), and focusing electrodes 16. In such a case, for example, a green phosphor (not shown) is disposed directly above the first upper electrode 14-1, a red phosphor (not shown) is disposed directly above each of the second upper electrode 14-2 and the fourth upper electrode 144, and a blue phosphor (not shown) is disposed directly above the third upper electrode 14-3. The focusing electrodes 16 are formed to surround each of the upper electrodes 14. With this arrangement, electrons emitted from the upper electrode 14 of a particular element reach only the phosphor disposed directly above the particular upper electrode 14. Thus, satisfactory color purity can be maintained, and blurring of the image patterns can be avoided.

Figure 20:
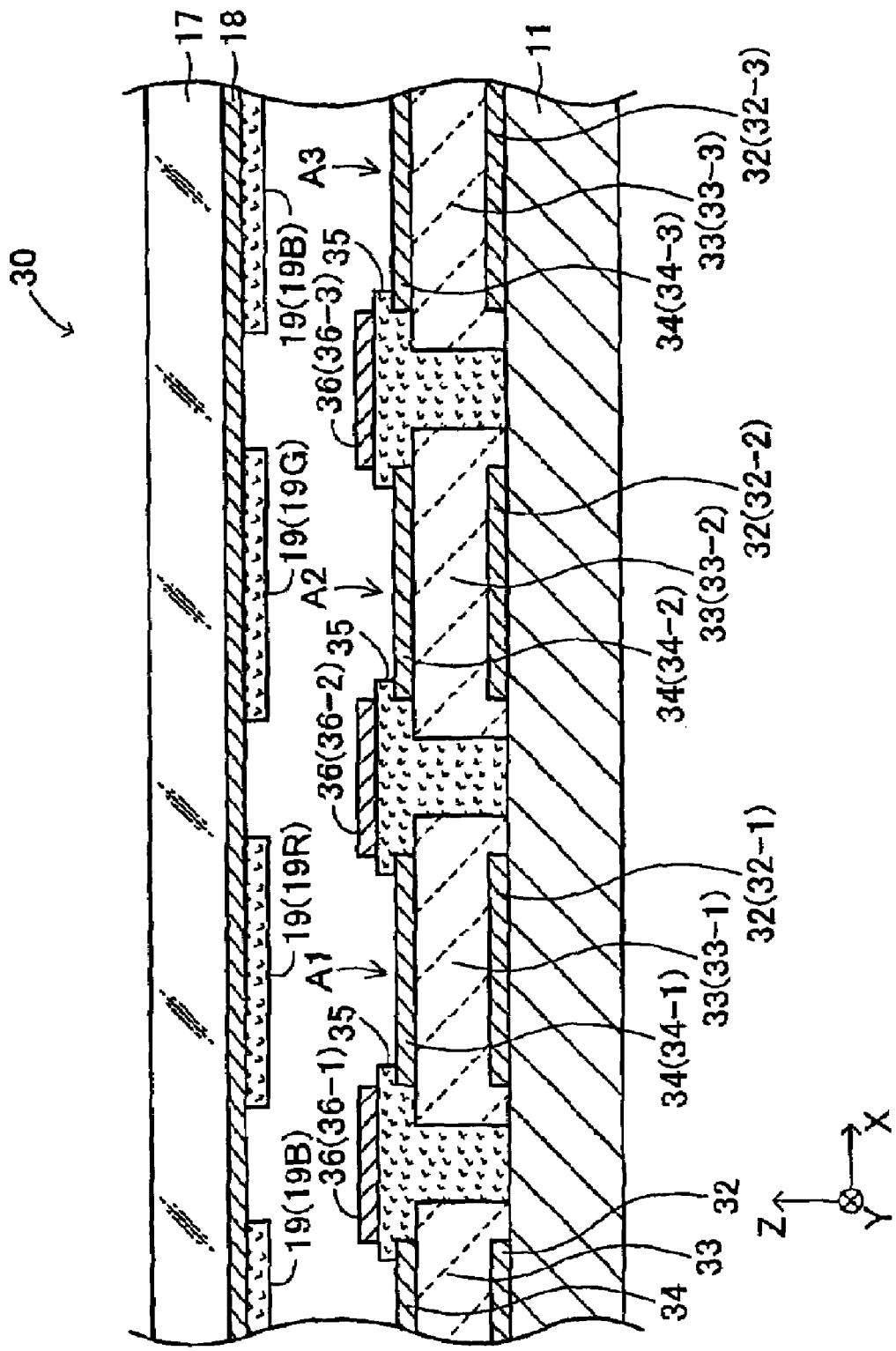
FIG. 20 is a partial cross-sectional view of another modification example of the electron-emitting apparatus shown in FIG. 1.
Figure 21:
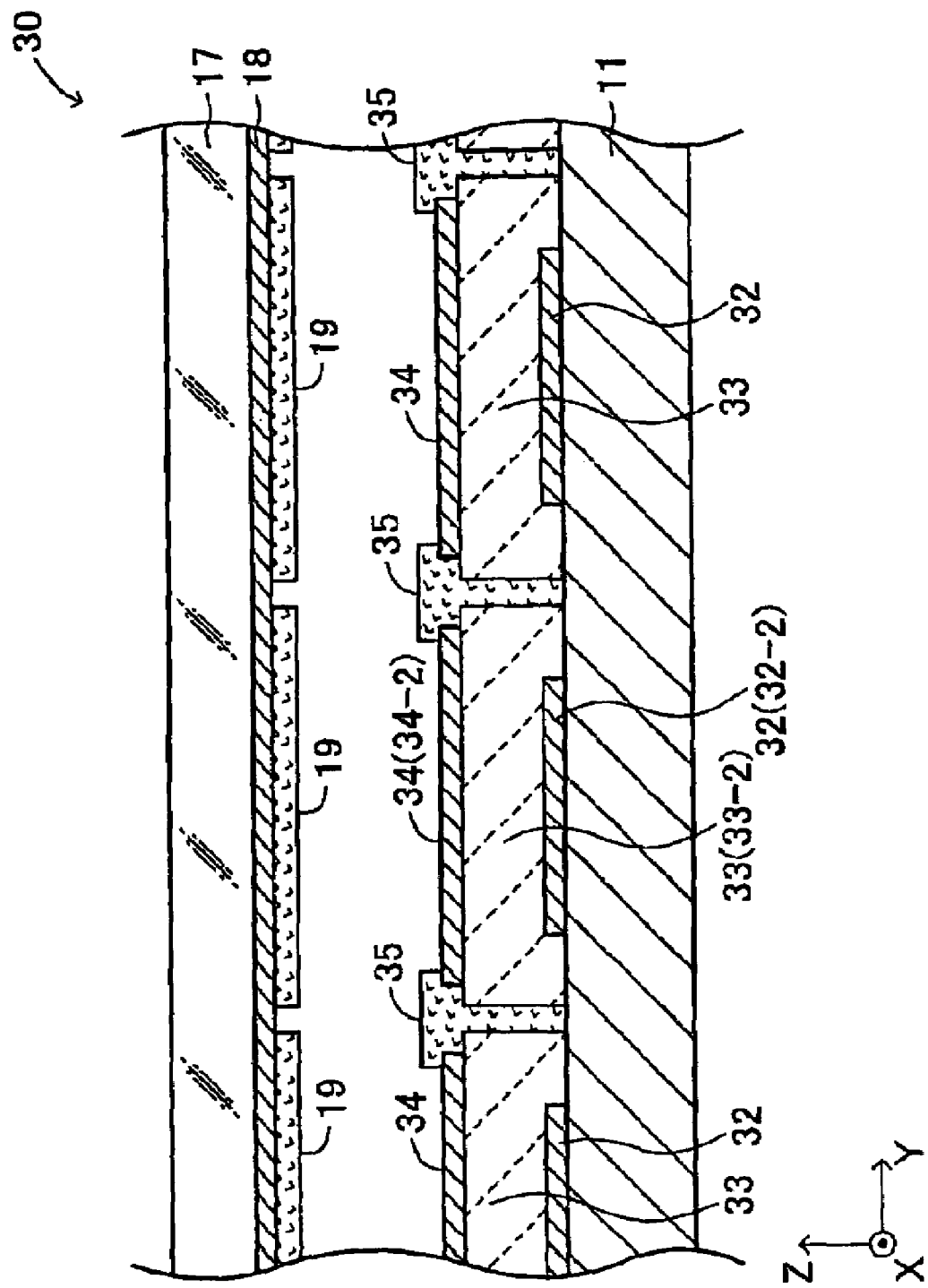
FIG. 21 is another partial cross-sectional view of the electron-emitting apparatus shown in FIG. 20.
Figure 22:
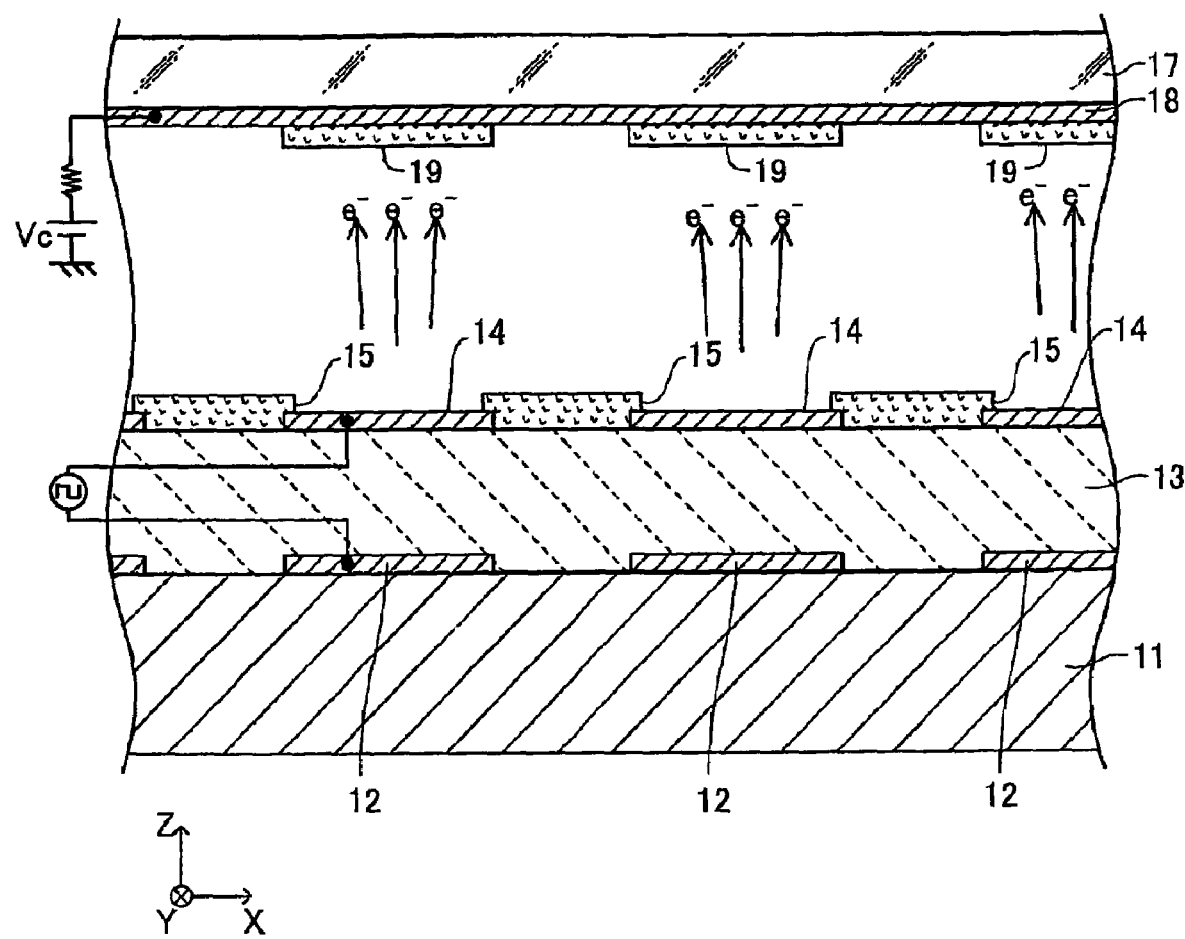
FIG. 22 is a partial cross-sectional view of an electro-emitting apparatus outside the present invention.
Figure 23:
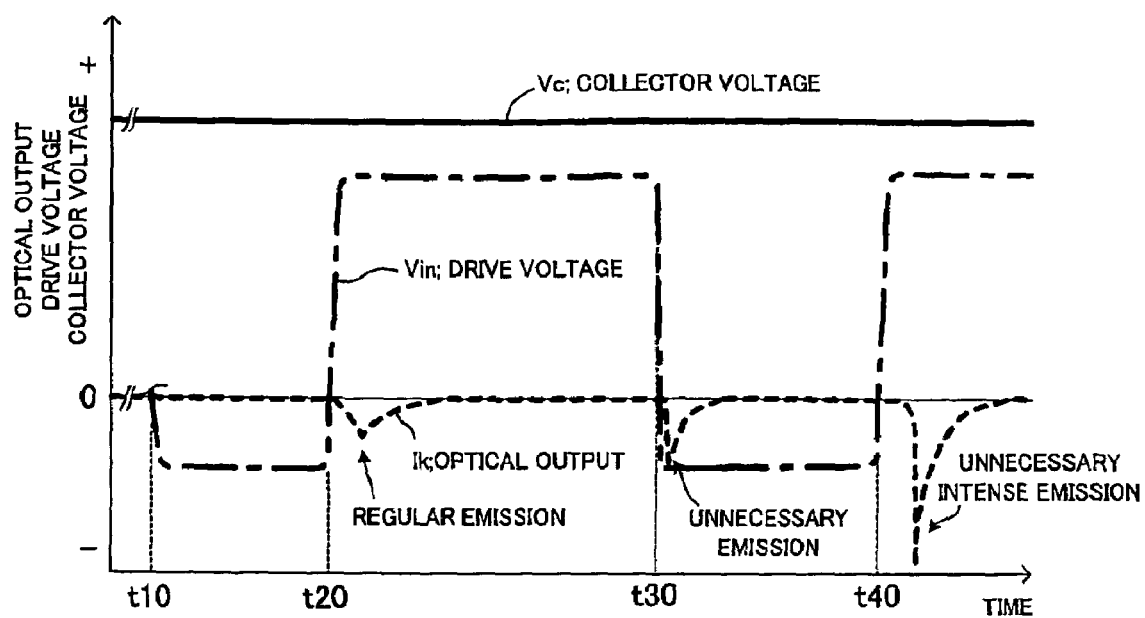
FIG. 23 is a time chart showing drive voltage, collector voltage, and optical output (value of current obtained by converting the emitted light) of the electron-emitting apparatus shown in FIG. 22.

As shown in FIGS. 20 and 21, an electron-emitting apparatus 30 according to the present invention may include a plurality of completely independent elements aligned on the substrate 11, each element including a lower electrode 32, an emitter section 33, and an upper electrode 34. In this apparatus, the gaps between the elements may be filled with insulators 35, and the focusing electrodes 36 may be disposed on the upper surfaces of the insulators 35 between the upper electrodes 34 adjacent to each other in the X-axis direction.

With the electron-emitting apparatus 30 having such a structure, electrons can be emitted from each of the elements either simultaneously or at independent timings. Thus, an independent collector electrode may be disposed above the upper electrode 34 of the corresponding element, and the collector voltage applying circuit may turn off or on the collector electrode based on the status of the element corresponding to the collector electrode.

Further, time-varying voltage Vs(t) may be applied to the focusing electrodes 16. In such a case, for example, a larger negative voltage may be applied to the focusing electrode 16 during the charge accumulation period Td than in the emission period Th so that unnecessary electron emission can be more securely suppressed during the charge accumulation period Td.

Moreover, the focusing electrode 16 may be maintained in the floating state during the charge accumulation period Td, and a predetermined potential may be applied to the focusing electrode 16 during the emission period Th. By this operation, generation of transient current due to capacity coupling between the focusing electrode 16 and the upper electrode 14 (or between the focusing electrode 16 and the lower electrode 12) can be avoided, and unnecessary power consumption can be avoided.

The substrate 11 may be made of a material primarily containing aluminum oxide or a material primarily made of a mixture of aluminum oxide and zirconium oxide.

What is claimed is:

1. An electron-emitting apparatus comprising:
    an element including:
        an emitter section made of a dielectric material,
        a lower electrode disposed below the emitter section, and
        an upper electrode disposed above the emitter section to oppose the lower electrode with the emitter section therebetween, the upper electrode having a plurality of micro through holes;
    a collector electrode disposed above the upper electrode to oppose the upper electrode;
    drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and
    collector voltage applying means for applying a first collector voltage to the collector electrode so that a collector voltage, which is a potential difference between the upper electrode and the collector electrode with reference to the potential of the upper electrode, becomes a positive first predetermined voltage,
    wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that, the application of the first collector voltage to the collector electrode is subsequently resumed at a particular time within a period starting from a third time point and ending at the first time point that comes after the third time point, the third time point being a time at which the electron accumulation caused by changing the interelectrode voltage to the negative predetermined voltage is substantially completed.

2. The electron-emitting apparatus according to claim 1, comprising:
    two or more of the elements, wherein
    the drive voltage applying means is configured such that the interelectrode voltage of each element is consecutively changed to the negative predetermined voltage, and the interelectrode voltage of all the elements is simultaneously changed to the positive predetermined voltage so that electrons are simultaneously emitted from all of the elements, and the collector voltage applying means is configured so as to resume to apply the first collector voltage to the collector electrode after the time point at which the electron accumulation is completed by the element whose interelectrode voltage is changed to the negative predetermined voltage at the latest timing among the elements.

3. The electron-emitting apparatus according to claim 1, wherein the collector voltage applying means is configured such that the second collector voltage is applied to the collector electrode by earthing the collector voltage.

4. An electron-emitting apparatus comprising:
an element including:
an emitter section made of a dielectric material,
a lower electrode disposed below the emitter section, and
an upper electrode disposed above the emitter section to oppose the lower electrode with the emitter section therebetween, the upper electrode having a plurality of micro through holes;
a collector electrode disposed above the upper electrode to oppose the upper electrode;
drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and
collector voltage applying means for applying a first collector voltage to the collector electrode so that a collector voltage, which is a potential difference between the upper electrode and the collector electrode with reference to the potential of the upper electrode, becomes a positive first predetermined voltage,
wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that the application of the first collector voltage to the collector electrode is resumed at a fourth time point at which the interelectrode voltage is again changed to the positive predetermined voltage.

5. An electron-emitting apparatus comprising:
an element including:
an emitter section made of a dielectric material,
a lower electrode disposed below the emitter section, and
an upper electrode disposed above the emitter section to oppose the lower electrode with the emitter section therebetween, the upper electrode having a plurality of micro through holes;
a collector electrode disposed above the upper electrode to oppose the upper electrode;
drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and
collector voltage applying means for applying a first collector voltage to the collector electrode so that a collector voltage, which is a potential difference between the upper electrode and the collector electrode with reference to the potential of the upper electrode, becomes a positive first predetermined voltage,
wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that the application of the first collector voltage to the collector electrode is subsequently resumed at a particular time within a period starting from immediately after a fifth time point at which inrush current flowing in the emitter section becomes maximum by changing the interelectrode voltage to the positive predetermined voltage and ending at a sixth time point at which polarization reversal in the emitter section is substantially completed while the interelectrode voltage is the positive predetermined voltage.

6. An electron-emitting apparatus comprising:
an element including:
an emitter section made of a dielectric material,
a lower electrode disposed below the emitter section, and
an upper electrode disposed above the emitter section to oppose the lower electrode with the emitter section therebetween, the upper electrode having a plurality of micro through holes;
a collector electrode disposed above the upper electrode to oppose the upper electrode;

drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and collector voltage applying means for applying a first collector voltage to the collector electrode so that a collector voltage, which is a potential difference between the upper electrode and the collector electrode with reference to the potential of the upper electrode, becomes a positive first predetermined voltage, wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that the application of the first collector voltage to the collector electrode is subsequently resumed at a particular time within a period starting from a sixth time point at which polarization reversal in the emitter portion is substantially completed by again changing the interelectrode voltage to the positive predetermined voltage and ending at the first time point that comes after the sixth time point.

7. An electron-emitting apparatus comprising:

an element including:
  an emitter section made of a dielectric material,
  a lower electrode disposed below the emitter section, and
  an upper electrode disposed above the emitter section to oppose the lower electrode with the emitter section therebetween, the upper electrode having a plurality of micro through holes;

a collector electrode disposed above the upper electrode to oppose the upper electrode;

drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and collector voltage applying means for applying a first collector voltage to the collector electrode so that a collector voltage, which is a potential difference between the upper electrode and the collector electrode with reference to the potential of the upper electrode, becomes a positive first predetermined voltage, wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that the application of the first collector voltage to the collector electrode is subsequently resumed at a particular time within a period starting from a sixth time point and ending at a seventh time point, the sixth time point being a time at which polarization reversal in the emitter section is substantially completed by again changing the interelectrode voltage to the positive predetermined voltage, and the seventh time point being a time at which the amount of electrons emitted from the emitter section and reaching the collector electrode per unit time becomes the maximum.

8. An electron-emitting apparatus comprising:

an element including:
  an emitter section made of a dielectric material,
  a lower electrode disposed below the emitter section, and
  an upper electrode disposed above the emitter section to oppose the lower electrode with the emitter section therebetween, the upper electrode having a plurality of micro through holes;

a collector electrode disposed above the upper electrode to oppose the upper electrode;

drive voltage applying means for repeatedly applying a drive voltage between the lower electrode and the upper electrode on a periodic basis, the drive voltage being a voltage that sets an interelectrode voltage, which is a potential difference between the lower electrode and the upper electrode with reference to the potential of the lower electrode, at a negative predetermined voltage so as to allow accumulation of electrons supplied from the upper electrode in portions of the emitter section near the upper electrode, the drive voltage subsequently being a voltage that sets the interelectrode voltage at a positive predetermined voltage so as to allow emission of the electrons accumulated in the emitter section through the micro through holes; and collector voltage applying means for applying a first collector voltage to the collector electrode so that a collector voltage, which is a potential difference between the upper electrode and the collector electrode with reference to the potential of the upper electrode, becomes a positive first predetermined voltage, wherein the collector voltage applying means is configured such that, at a particular time during the period starting from a first time point and ending at a second time point, a second collector voltage is applied to the collector electrode to change the collector voltage from the first predetermined voltage to a second predetermined voltage smaller than the first predetermined voltage, or the collector electrode is put into a floating state, the first time point being a time at which the electron emission caused by changing the interelectrode voltage to the positive predetermined voltage is substantially completed, and the second time point being a time at which the interelectrode voltage is changed to the negative predetermined voltage, and such that the application of the first collector voltage to the collector electrode is subsequently resumed at a time at which the actual potential difference between the lower and upper electrodes reaches a predetermined threshold voltage after the interelectrode is again changed to the positive predetermined voltage.

* * * * *